United States Patent
Cideciyan et al.

(10) Patent No.: US 7,679,535 B2
(45) Date of Patent: *Mar. 16, 2010

(54) HIGH-RATE RLL ENCODING

(75) Inventors: Roy D. Cideciyan, Rueschlikon (CH);
Evangelos S. Eleftheriou, Zurich (CH);
Thomas Mittelholzer, Zurich (CH);
Paul J. Seger, Tucson, AZ (US);
Keisuke Tanaka, Tokyo-to (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/185,095

(22) Filed: Aug. 3, 2008

(65) Prior Publication Data
US 2009/0027242 A1    Jan. 29, 2009

Related U.S. Application Data

(63) Continuation of application No. 11/749,711, filed on May 16, 2007, now Pat. No. 7,486,208.

(51) Int. Cl.
*H03M 5/00* (2006.01)
(52) U.S. Cl. ............... 341/58; 341/59; 360/48
(58) Field of Classification Search ........... 341/58, 341/50, 59; 360/40, 41, 48; 369/59.25
See application file for complete search history.

(56) References Cited

U.S. PATENT DOCUMENTS 4,707,681 A    11/1987   Eggenberger et al.
5,241,309 A    8/1993    Cideciyan et al.
6,184,806 B1   2/2001    Patapoutian et al.
6,201,485 B1   3/2001    McEwen et al.
6,229,458 B1   5/2001    Altekar et al.
6,456,208 B1   9/2002    Nazari et al.
6,476,737 B1   11/2002   Caroselli et al.
6,985,320 B2   1/2006    Blaum et al.
7,486,208 B2 * 2/2009    Cideciyan et al. ............. 341/58

OTHER PUBLICATIONS

R. D. Cideciyan, F. Dolivo, R. Hermann, W. Hirt and W. Schott, "A PRML System for Digital Magnetic Recording," IEEE J. Select. Areas Commun., vol. 10, pp. 38-56, Jan. 1992.

(Continued)

*Primary Examiner*—Peguy JeanPierre
(74) *Attorney, Agent, or Firm*—Dan Shifrin

(57) ABSTRACT

An unencoded m-bit data input sequence is divided into a block of n bits and a block of m−n bits. The block of n bits is divided into a first set of n+1 encoded bits, wherein at least one of P1 subblocks of the first set satisfies a G, M and I constraints. The first set of n+1 encoded bits is mapped into a second set of n+1 encoded bits wherein at least one of P2 subblocks of the second set gives rise to at least Q1 transitions after $1/(1+D^2)$ precoding. A second set of n+1 encoded bits is divided into P3 encoded subblocks and the P3 encoded subblocks are interleaved among (m−n)/s unencoded symbols so as to form a (m+1)-bit output sequence codeword which is then stored on a data storage medium.

29 Claims, 8 Drawing Sheets

OTHER PUBLICATIONS

J. D. Coker, E. Eleftheriou, R. L. Galbraith and W. Hirt, "Noise-Predictive Maximum Likelihood (NPML) Detection," IEEE Trans. Magn., vol. 34, pp. 110-117, Jan. 1998.

R. D. Cideciyan, E. Eleftheriou, B. H. Marcus and D. S. Modha, "Maximum Transition Run Codes for Generalized Partial Response Channels," IEEE J. Select. Areas Commun., vol. 19, pp. 619-634, Apr. 2001.

J. W. M. Bergmans, "Digital Baseband Transmission and Recording", Kluwer Academic Publishers, 1996.

* cited by examiner

Stage 1 Output

| b1 – b4 | b5 – b8 | b9 – b13 | b14 – b17 |
|---|---|---|---|

FIG. 3A

Stage 2 Output

| c1 – c8 | c9 – c17 |
|---|---|

FIG. 3B

Stage 3 Output

| y1 – y8 | y9 – y17 |
|---|---|

FIG. 3C

HIGH-RATE RLL ENCODING

RELATED APPLICATION DATA

The present application is a continuation application of, and claims the priority benefit of, commonly-assigned and co-pending U.S. application Ser. No. 11/749,711, entitled HIGH-RATE RLL ENCODING, filed on May 16, 2007, which application is hereby incorporated herein by reference in its entirety.

TECHNICAL FIELD

The present invention relates generally to RLL encoding and, in particular, to designing a mother code having a first rate which may then be used to design additional, higher-rate codes.

BACKGROUND ART

Runlength-limited (RLL) codes have been widely used in magnetic and optical data storage to eliminate sequences that are undesired for the processes of recording and reproducing digital data. Various classes of RLL codes are used in practice. For example, peak detection systems employing runlength-limited RLL(d,k) constrained codes such as rate-1/2 RLL(2, 7) and rate-2/3 RLL(1,7) codes have been predominant in digital magnetic storage at low normalized linear densities. At moderate normalized linear densities, the introduction of partial-response maximum-likelihood (PRML) detection channels into data storage required a different type of constrained codes. This class of codes, which are known as PRML(G,I) or PRML(0,G,I) codes, facilitates timing recovery and gain control, and limits the path memory length of the sequence detector, and therefore the decoding delay, without significantly degrading detector performance. PRML(G,I) codes may also be used in conjunction with $1/(1 \oplus D^2)$ precoders and with noise-predictive, maximum-likelihood (NPML) channels which generalize the PRML concept ($\oplus$ stands for the logical exclusive-OR operation). The G constraint limits the maximum runlength of zeros at the modulation encoder output (input of $1/(1 \oplus D^2)$ precoder) to G. The I constraint limits the maximum runlength of zeros in the even and odd interleave of the encoder output (input of $1/(1 \oplus D^2)$ precoder) to I.

The first PRML(G, I) code that was implemented in a data storage device had the code rate 8/9 and satisfied the constraints G=4 and I=4. In addition, it satisfied a VFO constraint, which is also known as the M constraint, allowing discrimination of encoded data from the synchronization preamble and therefore fast start-up of the PRML receiver. The M constraint limits the maximum runlength of ones at the modulation encoder output (input of $1/(1 \oplus D^2)$ precoder) to M. The class of RLL codes satisfying G, I and M constraints is known as PRML(G, I, M) codes. The recorded VFO pattern . . . ++−−++−− . . . (the output of a $1/(1 \oplus D^2)$ precoder) is received as a tone with frequency 1/(4T) at the center of the channel. The VFO constraint (M constraint) was generalized to constraints used to construct anti-whistle codes that exclude data patterns with zero or one spectral component in the frequency band (0, 1/(2T)). Hard disk drive (HDD) products often used architectures that did not require the VFO constraint. Therefore, high-rate PRML codes with rates higher than 8/9, which have been designed, satisfy G and I constraints but not necessarily the M constraint.

The RLL code used in Linear Tape Open (LTO) standards for generations 2 to 4 (hereinafter LTO 2-4) is a twins-constrained maximum-transition-run MTR(j,k,t) code that requires $1/(1 \oplus D)$ precoding. It satisfies j, k and t constraints at the input of the $1/(1 \oplus D)$ precoder. The k constraint limits the maximum runlength of zeros at the modulation encoder output (input of $1/(1 \oplus D)$ precoder) to k. The j constraint limits the maximum runlength of ones at the modulation encoder output (input of $1(1 \oplus D)$ precoder) to j. The twins constraint t limits the maximum number of consecutive twins (pair of zeros or pair of ones) at the modulation encoder output (input of $1/(1 \oplus D)$ precoder) to t. The G and I constraints at the input of $1/(1 \oplus D^2)$ precoders are equivalent to constraints j=G+1, k=G+1 and t=I at the input of $1/(1 \oplus D)$ precoders where both set of constraints PRML(G,I) and MTR (j,k,t) give rise to the same set of constraints on recorded patterns (output of precoder). The RLL code in LTO 2-4 is based on a rate-8/9 code that also satisfies the VFO constraint, rules out the Data Set Separator (DSS) and Resynchronization (Re Sync) patterns and ensures that each RLL codeword has at least one isolated transition. The concatenated rate of the RLL code in LTO 2-4 is 16/17 because a rate-8/9 encoded byte is concatenated with an uncoded byte. The constraints satisfied by the rate-16/17 RLL code in LTO 2-4 are equivalent to G=13, I=11 and M=23. Additionally, the RLL code parameter that is very important to error-rate performance with error-correction-coding (ECC) is error propagation. Error propagation is defined as the minimum length of a channel error burst in NRZ bits that causes two erroneous symbols in one Reed-Solomon (RS) codeword at the RS decoder input. Error propagation depends on the modulation code properties and the depth of interleaving of ECC codewords. In LTO 2-4 two-way interleaved RS codewords are RLL encoded and the error propagation of the modulation code is therefore 9 NRZ bits. Since most of the error patterns at the detector output are 1 to 4 NRZ bits long, most of the time one symbol in a RS codeword is in error as a result of a short (non-fading) error burst in the channel.

Construction of rate-8/9 PRML(G, I, M) codes has previously been described. Additionally, the rate of non-concatenated PRML(G, I, M) codes that have been constructed is less than 16/17.

The next generation LTO standard (LTO 5) will likely have a rate-32/33 or rate-48/49 RLL code in order to increase the format efficiency. One method for the design of such codes is the straightforward extension of the rate-16/17 LTO 2-4 code by inserting two or more uncoded bytes to obtain a rate-32/33 or rate-48/49 code, respectively. However, this solution results in a rate-32/33 RLL code with parameters G=29, I=19, M=39 or a rate-48/49 RLL code with parameters G=45, I=27, M=55. These values are not acceptable because the constraints are too weak. Another solution would be to generate a rate-16/17 encode and decode table using a computer and use computer-aided design tools to generate Boolean-based or ROM-based logic for encoding and decoding based on the encode and decode table. However, this solution is too complex and would require more than 500,000 gates per channel to implement. Additionally, the encoding operation needs a compact representation such that it can be included into the LTO 5 standard; specifying 65,536 17-bit codewords in the LTO 5 standard is not acceptable. Therefore, there is a need for an algorithmic approach to design an RLL code that satisfies similar constraints as the LTO 2-4 RLL code does.

SUMMARY OF THE INVENTION

The present invention provides a method for encoding a data input sequence of m bits into an output sequence codeword of m+1 bits, where m is an integer multiple of an ECC symbol size s. The method includes the steps of receiving a data stream of unencoded m-bit input sequences and dividing each m-bit input sequence into a first block of n bits and a second block of m−n unencoded bits, where n is an integer multiple of s. The first block of n bits is divided into a first set of n+1 encoded bits, wherein at least one of P1 subblocks of the first set of n+1 bits satisfies a G constraint, an M constraint and an I constraint. The first set of n+1 encoded bits is mapped in a one-to-one manner into a second set of n+1 encoded bits wherein at least one of P2 subblocks of the second set of n+1 bits gives rise to at least Q1 transitions after $1/(1+D^2)$ precoding. The second set of n+1 encoded bits is divided into P3 encoded subblocks and the P3 encoded subblocks are interleaved among (m−n)/s unencoded symbols so as to form the (m+1)-bit output sequence codeword. The output sequence codeword is then stored on a data storage medium.

In one embodiment, an encoder generates a rate-16/17 PRML(G=6, I=7, M=15) mother code from which higher rate codes may be generated. In various embodiments, such higher rate codes include a rate-32/33 PRML(G=14, I=11, M=23) code (RLL 1), a rate-48/49 PRML(G=22, I=15, M=31) code (RLL 2) and a rate-48/49 PRML(G=14, I=19, M=39) code (RLL 3).

BRIEF DESCRIPTION OF THE DRAWINGS

FIGS. 3A, 3B and 3C are representations of the output blocks from the first, second and third stages, respectively, of the rate-16/17 encoder of the present invention;

DETAILED DESCRIPTION OF THE PREFERRED EMBODIMENT

Figure 1:
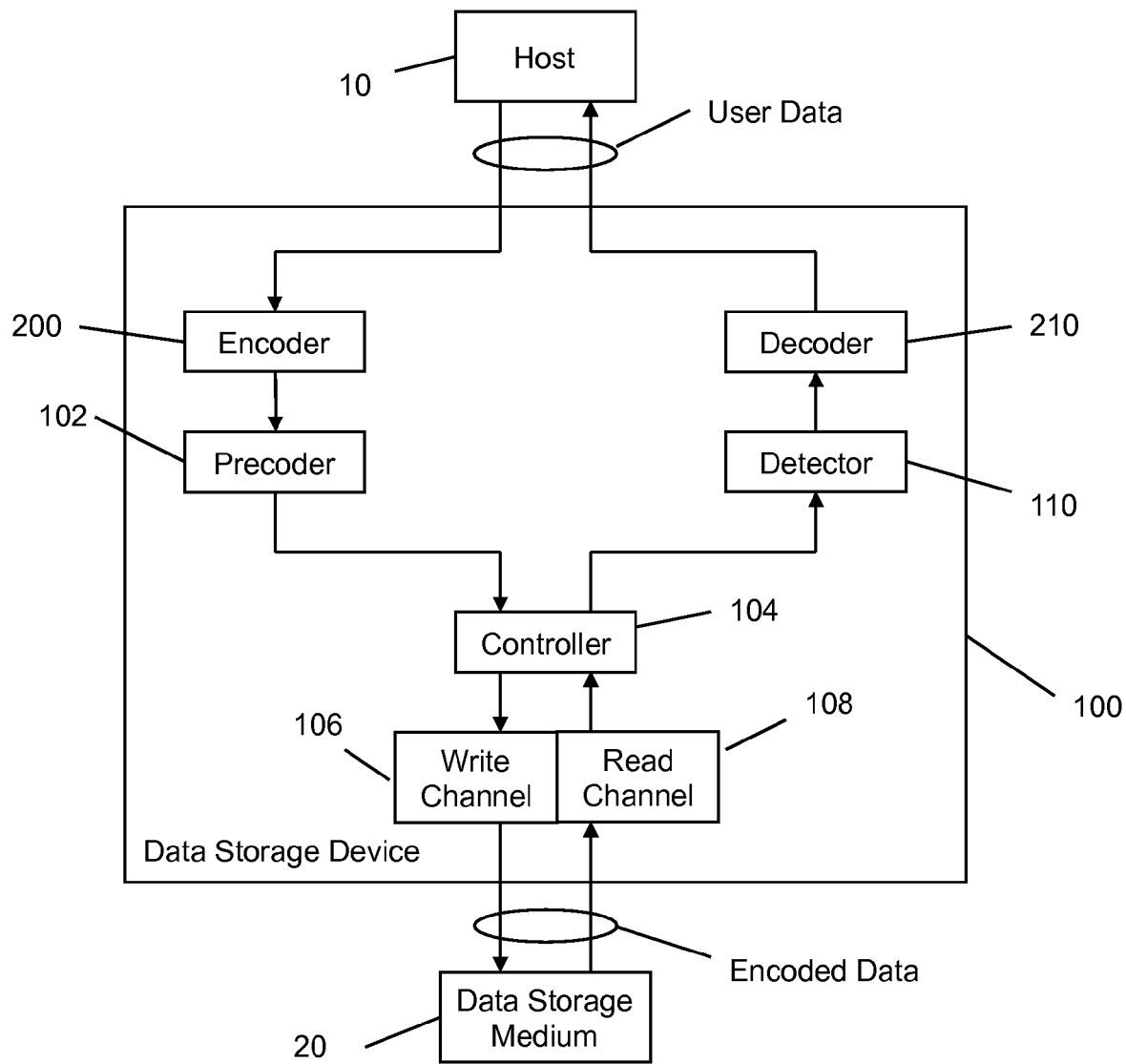
FIG. 1 is a high level block diagram of a data storage device in which the present invention may be implemented.

Many of the functional units described in this specification have been illustrated in the Figures as blocks, in order to more particularly emphasize their implementation independence. For example, a block may be implemented as a hardware circuit comprising custom VLSI circuits or gate arrays, off-the-shelf semiconductors such as logic chips, transistors, or other discrete components. A block may also be implemented in programmable hardware devices such as field programmable gate arrays, programmable array logic, programmable logic devices or the like.

Blocks may also be implemented in software for execution by various types of processors. An identified block of executable code may, for instance, comprise one or more physical or logical blocks of computer instructions which may, for instance, be organized as an object, procedure, or function. Nevertheless, the executables of an identified block need not be physically located together, but may comprise disparate instructions stored in different locations which, when joined logically together, comprise the block and achieve the stated purpose for the block.

Indeed, a block of executable code could be a single instruction, or many instructions, and may even be distributed over several different code segments, among different programs, and across several memory devices. Similarly, operational data may be identified and illustrated herein within blocks, and may be embodied in any suitable form and organized within any suitable type of data structure. The operational data may be collected as a single data set, or may be distributed over different locations including over different storage devices, and may exist, at least partially, merely as electronic signals on a system or network.

Furthermore, the described features, structures, or characteristics of the invention may be combined in any suitable manner in one or more embodiments. In the following description, numerous specific details are provided, such as examples of programming, software blocks, logic blocks, user selections, network transactions, database queries, database structures, hardware blocks, hardware circuits, hardware chips, etc., to provide a thorough understanding of embodiments of the invention. One skilled in the relevant art will recognize, however, that the invention may be practiced without one or more of the specific details, or with other methods, components, and so forth. In other instances, well-known steps, components or operations are not shown or described in detail to avoid obscuring aspects of the invention.

The present invention provides an algorithmic approach to the design of higher-rate PRML(G, I, M) codes which also enforce a minimum number of transitions per codeword. A rate-16/17 PRML(G=6, I=7, M=15) "mother code" is provided that enforces at least four transitions per codeword. To this end the input to the encoder is partitioned into a first set of blocks which are mapped into a second set of blocks and G, I and M constraints are imposed on at least one of the second set of blocks. The encoding operation is initially performed by detecting violations and indicating in encoded data the type of violations that have occurred. Further stages of encoding by violation detection and substitution tighten the code constraints and rule out DSS and Re Sync patterns. The mother code is then used to construct higher-rate 32/33 or 48/49 PRML(G, I, M) codes by combining uncoded 8-bit bytes with the 17-bit output from the mother code. The present invention also provides a rate-32/33 PRML(G=14, I=11, M=23) code (RLL 1), a rate-48/49 PRML(G=22, I=15, M=31) code (RLL 2) and a rate-48/49 PRML(G=14, I=19, M=39) code (RLL 3).

Notation

The notations x(i) and $x_i$ are used interchangeably herein to denote the components of a vector x. The following representations are used for a row vector x with n components $$x=[x(1)x(2)\ldots x(n)]=[x_1 x_2 \ldots x_n]=[x1x2\ldots xn]=x \quad (1:n)$$

Column vectors are often specified by the transpose of a row vector and the superscript T is used to indicate the transpose operation.

Two different notations are used herein for Boolean operations. The following convention has been used to specify Boolean code constraints and to perform Boolean operations involving multiplication of a matrix and a vector: overbar stands for negation, multiplication for AND, and addition for OR. Among these three operations, negation has the highest precedence, AND (multiplication) has second highest precedence and OR (addition) has the lowest precedence. Exclusive-OR (XOR) is indicated by $\oplus$.

Encoder and decoder hardware based on Boolean logic is specified using the MATLAB notation for Boolean operations. In particular, ~ stands for negation, & for AND, and | for OR. Again, among these three operations, negation (~) has the highest precedence, followed by AND (&) and OR (|) which has the lowest precedence, i.e., the usual Boolean precedence rules apply.

The next section describes the requirements upon the resulting codes in terms of prohibited output sequences, which therefore determines the requirements on the mother code. The steps in creating the mother code are described both in text and via illustration in compact matrix notation. The section is followed by a section describing a corresponding decoder for the mother code. Next are sections which include Boolean listings in MATLAB format of the requirements for the third encoding and decoding stages for the mother code. Finally, the last three sections describe the design of rate-32/33 PRML(G=14, I=11, M=23) code, rate-48/49 PRML (G=22, I=15, M=31) code and rate-48/49 PRML(G=14, I=19, M=39) code from the mother code.

FIG. 1 is a high level block diagram of a data storage device 100 in which the present invention may be implemented. The device 100 includes an encoder 200 which receives user data from a host 10. The encoder 200 encodes the data, as will be described herein, and passes the encoded data to a precoder 102 which may include write-equalization functionality as in LTO standards. A controller 104 receives the precoded data and transmits it to a write channel 106 which records the encoded data onto a data storage medium 20.

The storage device 100 further includes a read channel 108 which reads the data from the storage medium 20 and transmits it to the controller 104. The controller 104 sends the data to a detector 110 which processes (e.g., inverse precoding) and passes it on to a decoder 210. The decoder decodes the data, as will described herein, and sends the decoded data to the host 10.

Figures 2A, 2B:
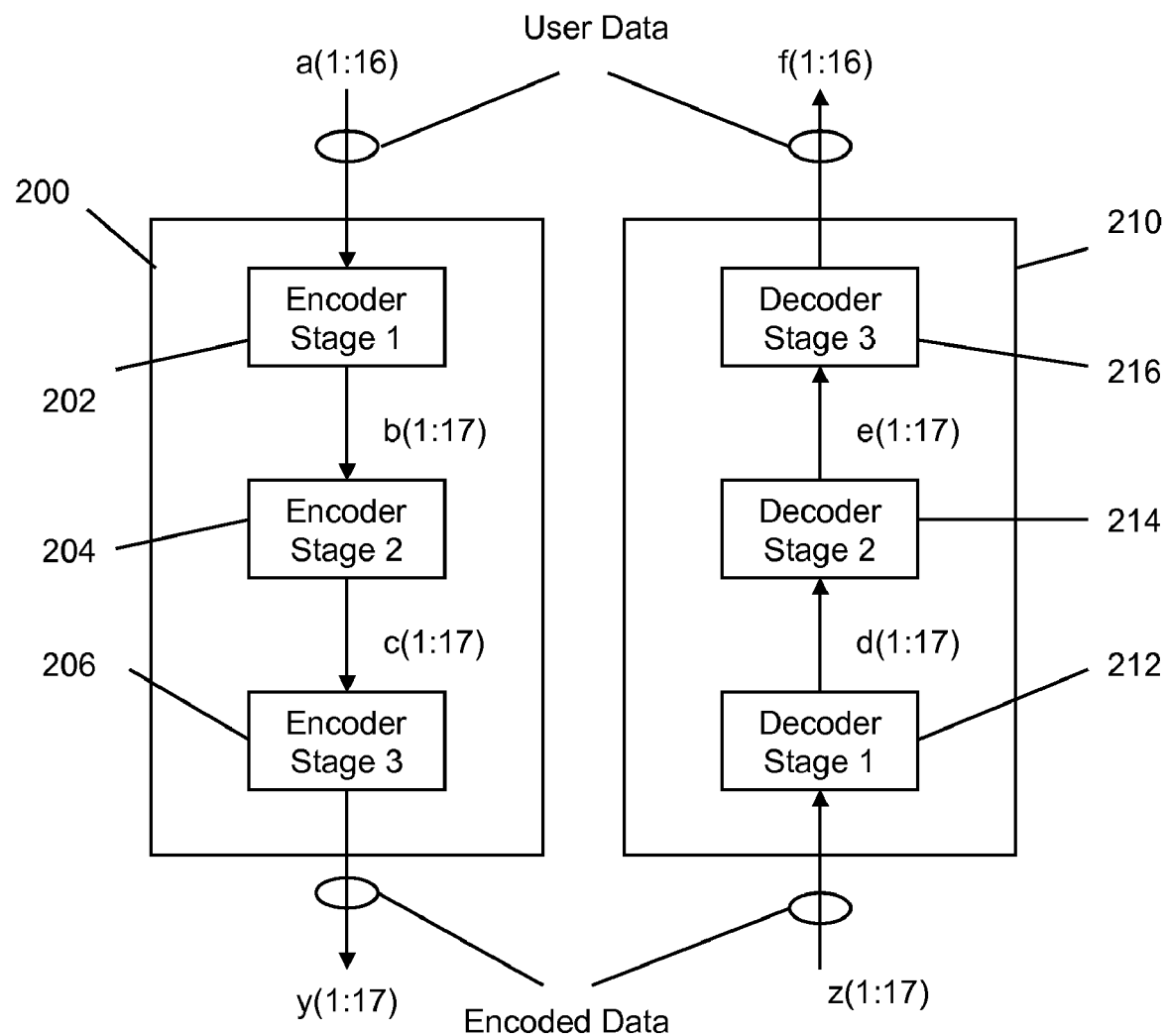
FIG. 2A is a block diagram of a rate-16/17 encoder to generate the mother code of the present invention.
FIG. 2B is a block diagram of a decoder of the present invention.

Construction of Rate-16/17 PRML(G=6, I=7, M=15) Mother Code with Minimum Transition Density FIG. 2A is a block diagram of the encoder 200. The encoder 200 receives unencoded user data a(1:16) and, using K encoding stages, outputs a rate-16/17 PRML(G=6, I=7, M=15) mother code y(1:17). The example of the encoder 200 which is illustrated and described herein includes K=3 encoding stages 202, 204, 206, although more or fewer stages may be used. The output of the k-th encoding stage $o_k^E$ (binary column vector) can be described by the multiplication of a binary transformation matrix $M_k^E = g_k^E(i_k^E)$ and a binary partitioning vector $n_k^E = h_k^E(i_k^E)$ (binary column vector) that depend on the binary input $i_k^E$ (binary column vector) as follows:

$$o_k^E = M_k^E n_k^E = g_k^E(i_k^E) h_k^E(i_k^E)$$

where the superscript E refers to the encoding operation and the addition and the multiplication operations in the matrix multiplication are Boolean OR and Boolean AND operations, respectively. For a given 16-bit encoder input, only one of the components of a partitioning vector is one whereas all the other components are zero. This property is related to the fact that the input space is partitioned in a mutually exclusive manner. Finally, concatenation of encoding stages is done such that the output of the k-th encoding stage, for k=1,2 in a three-stage system, is the input of the next encoding stage, i.e., $i_{k+1}^E = o_k^E$.

First Encoder Stage

The first encoder stage 202 ensures that at least one of $P_1$=4 subblocks of the 17-bit output of the first encoder stage 202 satisfy G, I and M constraints. The output $o_1^E = b^T = [b_1\ b_2\ \ldots\ b_{17}]^T$ of the first encoder stage 202 is a 17×1 binary column vector. The $P_1$=4 subblocks of the 17-bit output of the stage 202 are illustrated in FIG. 3A as $b_1\ b_2\ b_3\ b_4$, $b_5\ b_6\ b_7\ b_8$, $b_9\ b_{10}\ b_{11}\ b_{12}\ b_{13}$ and $b_{14}\ b_{15}\ b_{16}\ b_{17}$. Concatenation of the four output vectors results in a PRML(G=6, I=9, M=20) code. The first four bits $b_1\ b_2\ b_3\ b_4$ are not allowed to be all zero. Similarly, the next four bits $b_5\ b_6\ b_7\ b_8$ are also not allowed to be all zero. The next five bits $b_9\ b_{10}\ b_{11}\ b_{12}\ b_{13}$ are not allowed to be any of the following twelve 5-bit combinations {00000, 00010, 01000, 01010, 00001, 00100, 00101, 10000, 10001, 10100, 10101, 11111}, thereby imposing G, I and M constraints on this 5-bit combination. The last four bits are also not allowed to be all zero. Note that only a G constraint was imposed on the 4-bit combinations.

The output b may be partitioned into two blocks of size 8 bits and 9 bits which will be used to construct a rate-32/33 PRML(G, I, M) code. Similarly, the output b may be partitioned into four blocks of size 4 bits, 4 bits, 5 bits and 4 bits which will be used to construct a rate-48/49 PRML(G, I, M) code. At the end of the first encoder stage 202 there are at most $(2^4-1)\ (2^4-1)\ (2^5-12)\ (2^4-1)=67,500$ codewords. Since $67,500 > 2^{16}$ the first stage may be accomplished with a rate-16/17 code mapping 16 bits into 17 bits. Note that only three of the twelve excluded bit patterns $b_9\ b_{10}\ b_{11}\ b_{12}\ b_{13}$, viz., {00010, 01010, 11111} have a 1 in the fourth position, i.e., $b_{12}$=1. Therefore, if $a_1\ a_2\ a_3\ a_4$ is nonzero, $a_5\ a_6\ a_7\ a_8$ is nonzero, $a_9\ a_{10}\ a_{11}\ a_{12}$ is none of the three bit patterns {0000, 0100, 1111} and $a_{13}\ a_{14}\ a_{15}\ a_{16}$ is nonzero, then the 16×1 encoder input vector $i_1^E = a^T = [a_1\ a_2\ \ldots\ a_{16}]^T$ is mapped into $o_1^E = b^T = [b_1\ b_2\ \ldots\ b_{17}]^T$ using the substitutions $[b_1\ b_2\ b_3\ b_4] = [a_1\ a_2\ a_3\ a_4]$, $[b_5\ b_6\ b_7\ b_8] = [a_5\ a_6\ a_7\ a_8]$, $[b_9\ b_{10}\ b_{11}\ b_{13}] = [a_9\ a_{10}\ a_{11}\ a_{12}]$ $[b_{14}\ b_{15}\ b_{16}\ b_{17}] = [a_{13}\ a_{14}\ a_{15}\ a_{16}]$ and $b_{12}$=1. Therefore, there are six types of violation that can occur: $a_1\ a_2\ a_3\ a_4$ is all zero, $a_5\ a_6\ a_7\ a_8$ is all zero, $a_9\ a_{10}\ a_{11}\ a_{12}$ is one of the three bit patterns {0000, 0100, 1111} or $a_{13}\ a_{14}\ a_{15}\ a_{16}$ is all zero. A violation can be indicated by $b_{12}$=0 and $b_{10}$=1. The type of a single violation can be indicated by three bits $[b_9\ b_{11}\ b_{13}]$. These three bits are not allowed to be all zeros in order not to violate the I code constraint. And one of the three-bit combinations, the all-one bit pattern $[b_9\ b_{11}\ b_{13}] = [111]$ in the example, is used to indicate that more than one violation has occurred. Thus, there are exactly six remaining three bit patterns {001, 010, 011, 100, 101, 110} which can be used to indicate the type of a single violation. If only one of the patterns $a_1\ a_2\ a_3\ a_4$, $a_5\ a_6\ a_7\ a_8$ and $a_{13}\ a_{14}\ a_{15}\ a_{16}$ is all zero, then the information in $a_9\ a_{10}\ a_{11}\ a_{12}$ is placed into the bit pattern that is in violation. For example, if $a_5\ a_6\ a_7\ a_8$ is all zero, then $[b_5\ b_6\ b_7\ b_8] = [a_9\ a_{10}\ a_{11}\ a_{12}]$, etc. One partition for no violations and 6 partitions for a single violation have so far been obtained. There are also 12 possible two violations and 13 possible three or four violations for a total of 1+6+12+13=32 first-stage partitions. If two, three or four violations occur, the type of violation is indicated in the output as in the case of a single violation and the non-violation blocks are reshuffled if necessary. In the next section, the exact expression for the 32×1 binary partitioning vector $n_1^E = h_1^E(i_1^E) = p^T = [p(1)\ p(2)\ \ldots\ p(32)]^T$ and binary 17×32 matrix $M_1^E = g_1^E(i_1^E) = [M_{1,1}^E M_{1,2}^E]$ will be described in terms of two 17×16 submatrices $B_1$ and $B_2$.

The constraints satisfied by $O_1^E = b^T = [b_1\ b_2\ \ldots\ b_{17}]^T$ following the first encoder stage 202 are G Constraints:

$$b_1+b_2+b_3+b_4=1$$

$$b_5+b_6+b_7+b_8=1$$

$$b_9+b_{10}+b_{11}+b_{12}=1$$

$$b_{10}+b_{11}+b_{12}+b_{13}=1$$

$$b_{14}+b_{15}+b_{16}+b_{17}=1$$

I Constraints:

$$b_9+b_{11}+b_{13}=1$$

$$b_{10}+b_{12}=1$$

M Constraints:

$$b_9\,b_{10}\,b_{11}\,b_{12}\,b_{13}=0$$

Therefore, the code obtained at the output of the first encoder stage 202 is a PRML(G=6, I=9, M=20) code.

Second Encoder Stage

The second encoder stage 204 further tightens the code constraints/and M by detection of prohibited patterns and subsequent substitution with a desired pattern that does not violate the code can be uniquely recognized during the decoding. The first encoder stage 202 ensures that the third of the $P_1=4$ subblocks of the 17-bit output b of the first encoder stage 202 satisfies G, I and M constraints. The first encoder stage 202 further ensures that the remaining three 4-bit subblocks satisfy a G constraint by not allowing the 4-bit allzero pattern to occur as a subblock. The second encoder stage 204 remaps undesired 17-bit outputs b of the first encoder stage 202 into desired 17-bit outputs c. FIG. 3B illustrates the two subblocks of the 17-bit output c of the second encoder stage 204. Specifically, the second encoder stage 204 detects prohibited patterns and replaces them with substitute patterns and therefore ensures that the first of the two subblocks of the 17-bit output of the second encoder stage 204 c satisfies/and M constraints. The first subblock of the 17-bit output of the second encoder stage 204 is $c_1\,c_2\,c_3\,c_4\,c_5\,C_6\,c_7\,c_8$ and the second subblock is $c_9\,c_{10}\,c_{11}\,c_{12}\,c_{13}\,c_{14}\,c_{15}\,c_{16}\,c_{17}$. Note that the second subblock already satisfies I and M constraints as a result of the encoding in the first stage. TABLE I shows the prohibited patterns and the corresponding substitute patterns in the second encoder stage 204.

TABLE I

| 17-bit Prohibited Pattern b | 17-bit Substitute Pattern c |
|---|---|
| 0 b$_2$ 0 b$_4$ 0 b$_6$ 0 b$_8$ b$_9$ b$_{10}$ b$_{11}$ b$_{12}$ b$_{13}$ b$_{14}$ b$_{15}$ b$_{16}$ b$_{17}$ | b$_2$ 0 b$_4$ b$_{14}$ b$_6$ b$_{10}$ b$_8$ b$_{12}$ b$_9$ 0 b$_{11}$ 0 b$_{13}$ 1 b$_{15}$ b$_{16}$ b$_{17}$ |
| b$_1$ 0 b$_3$ 0 b$_5$ 0 b$_7$ 0 b$_9$ b$_{10}$ b$_{11}$ b$_{12}$ b$_{13}$ b$_{14}$ b$_{15}$ b$_{16}$ b$_{17}$ | b$_{14}$ 1 b$_9$ b$_{15}$ b$_{11}$ b$_{10}$ b$_{13}$ b$_{12}$ b$_1$ 0 b$_3$ 0 b$_5$ 1 b$_7$ b$_{16}$ b$_{17}$ |
| 1 1 1 1 1 1 1 1 b$_9$ b$_{10}$ b$_{11}$ b$_{12}$ b$_{13}$ b$_{14}$ b$_{15}$ b$_{16}$ b$_{17}$ | b$_{14}$ b$_{15}$ 1 b$_9$ b$_{10}$ b$_{11}$ b$_{12}$ b$_{13}$ 1 1 1 1 1 0 1 b$_{16}$ b$_{17}$ |

The bold pattern within the prohibited pattern b is used to detect violations during the second stage of encoding whereas the bold pattern in the substitute pattern c or d (if the presence of channel errors and errors in the first decoder stage 212 is considered, then c, the output of the second encoder stage 204, becomes d, the input of the second decoder stage 214) is used to detect required inverse substitution during the second stage of decoding. If none of the three prohibited patterns is detected during the second encoder stage 204, the output of the second encoder stage 204 is equal to its input, i.e., c=b.

Therefore, there are four partitions (three substitutions plus absence of substitution) in the second encoder stage 204.

The constraints satisfied by $o_2^{E=cT}=[c_1\,c_2\,\ldots\,c_{17}]^T$ following the second encoder stage 204 are G Constraints:

$$c_1+c_2+c_3+c_4=1$$

$$c_5+c_6+c_7+c_8=1$$

$$c_6+c_7+c_8+c_9+c_{10}+c_{11}+c_{12}=1$$

$$c_{10}+c_{11}+c_{12}+c_{13}+c_{14}=1$$

$$c_{14}+c_{15}+c_{16}+c_{17}=1$$

I Constraints:

$$c_1+c_3+c_5+c_7=1$$

$$c_2+c_4+c_6+c_8=1$$

$$c_9+c_{11}+c_{13}=1$$

$$c_{10}+c_{12}+c_{14}=1$$

$$c_6+c_8+c_{10}+c_{12}=1$$

M Constraints:

$$c_9\,c_{10}\,c_{11}\,c_{12}\,c_{13}\,c_{14}=0$$

$$c_1\,c_2\,c_3\,c_4\,c_5\,c_6\,c_7\,c_8=0$$

Therefore, the code obtained at the output of the second encoder stage 204 is a PRML(G=6, I=7, M=15) code.

Third Encoder Stage

FIG. 3C illustrates the $P_2=2$ subblocks of the 17-bit output y of the third encoder stage 206. The third encoder stage 206 increases the minimum transition density and ensures that the output of the encoder y gives rise to at least $Q_2=4$ transitions in the recorded pattern subsequent to $1/(1\oplus D^2)$ precoding. The motivation behind this step is to rule out (that is, prevent them from appearing) two low-transition-density patterns from modulation encoded data: the data separator sequence (DSS), a sequence with a period of 24 bits, and the 34-bit Re Sync pattern in LTO 4. It is noted that DSS consists of consecutive 12T magnets where T is the channel bit period (magnetization remains the same for an interval of 12T if write equalization is not taken into account) whereas Re Sync in LTO 4 consists of a 10T magnet, followed by a 11T magnet and a 12T magnet. More specifically, the third encoder stage 206 ensures that each of the encoded blocks $[y_1\,y_2\,y_3\,y_4\,y_5\,y_6\,y_7\,y_8]$ and $[y_9\,y_{10}\,y_{11}\,y_{12}\,y_{13}\,y_{14}\,y_{15}\,y_{16}\,y_{17}]$, when converted into NRZI notation, will result in at least two transitions (NRZI ones). Therefore, the output y of the entire encoder gives rise to at least $Q_2=4$ transitions in the recorded pattern subsequent to $1/(1\oplus D^2)$ precoding. As previously stated, this code property is used to ensure that the low-transition-density patterns DSS and Re Sync are ruled out in modulation encoded data.

Coded data y must be precoded using a $1/(1\oplus D^2)$ precoder. It is well known that a $1(1\oplus D^2)$ precoder can be represented by the serial concatenation of two precoders of type $1/(1\oplus D)$. In LTO 1-4 $1/(1\oplus D)$ precoding is performed in conjunction with write equalization. Therefore, $1/(1\oplus D)$ precoding of coded data y would be sufficient. In the following, the notation y' is used for $1/(1\oplus D)$ precoded coded data y. Note that the components of y' are bits in NRZI notation (0 represents no transition, 1 represents transition). Uncoded data may either be not precoded at all, $1/(1\oplus D)$ precoded or $1/(1\oplus D^2)$ precoded. From an error-rate performance viewpoint, it is preferable to not precode the uncoded data. However, because $1/(1 \oplus D)$ precoding is already used in conjunction with write equalization in LTO 1-4, it may be more desirable to use the $1/(1 \oplus D)$ precoding. Therefore, assuming that $1/(1 \oplus D)$ (NRZI) precoding is used for uncoded data and the uncoded bit preceding the first coded subblock $[y_1\ y_2\ y_3\ y_4\ y_5\ y_6\ y_7\ y_8]$ is $U_1$ and the uncoded bit (NRZI) preceding the second coded subblock $[y_9\ y_{10}\ y_{11}\ y_{12}\ y_{13}\ y_{14}\ y_{15}\ y_{16}\ y_{17}]$ is $U_2$, the minimum transition density constraints translate into two sets of requirements.

The first set of requirements, which ensure that the first coded subblock gives rise to at least $Q_1=2$ transitions after $1/(1 \oplus D^2)$ precoding, is $$U_1 + \sum_{i=1}^{8} y'_i \geq 2$$

where all of the additions in the above equations are integer additions $$y'_1 = U_1 \oplus y_1$$

$$y'_i = y'_{i-1} \oplus y_i, i=2, \ldots, 8$$

and $[y'_1\ y'_2\ y'_3\ y'_4\ y'_5\ y'_6\ y'_7\ y'_8]$ is the $1/(1 \oplus D)$ precoded first subblock.

The second set of requirements, which ensure that the second coded subblock gives rise to at least $Q_1=2$ transitions after $1/(1 \oplus D^2)$ precoding, is:

$$U_2 + \sum_{i=9}^{17} y'_i \geq 2$$

where all of the additions in the above equations are integer additions $$y'_9 = U_2 \oplus y_9$$

$$y'_i = y'_{i-1} \oplus y_i, i=10, \ldots, 17$$

and $[y'_9\ y'_{10}\ y'_{11}\ y'_{12}\ y'_{13}\ y'_{14}\ y'_{15}\ y'_{16}\ y'_{17}]$ is the $1/(1 \oplus D)$ precoded second subblock.

The third encoder stage 206 remaps undesired 17-bit outputs of the second encoder stage 204 c into desired 17-bit outputs y. Specifically, the third encoder stage 206 detects prohibited patterns and replaces them with substitute patterns to ensure that each of the $P_2=2$ subblocks (FIG. 3C) of the 17-bit output y of the third encoder stage 206 gives rise to at least two transitions in the recorded pattern subsequent to $1/(1 \oplus D^2)$ precoding. The first subblock of the 17-bit output of the third encoder stage 206 is $y_1\ y_2\ y_3\ y_4\ y_5\ y_6\ y_7\ y_8$ and the second subblock is $y_9\ y_{10}\ y_{11}\ y_{12}\ y_{13}\ y_{14}\ y_{15}\ y_{16}\ y_{17}$. TABLE II shows the prohibited patterns and the corresponding substitute patterns in the third (last) encoding stage.

TABLE II

| 17-bit Prohibited Pattern c | 17-bit Substitute Pattern y |
|---|---|
| 0 0 0 1 1 0 0 0 $c_9\ c_{10}\ c_{11}\ c_{12}$ $c_{13}\ c_{14}\ c_{15}\ c_{16}\ c_{17}$ | $c_{10}\ c_{12}$ 1 1 0 0 0 0 $c_9$ 1 $c_{11}$ 0 $c_{13}\ c_{14}\ c_{15}\ c_{16}\ c_{17}$ |
| $c_1\ c_2\ c_3\ c_4\ c_5\ c_6\ c_7\ c_8$ 0 0 0 0 1 1 0 0 0 | $c_1\ c_2\ c_3\ c_4\ c_5\ c_6$ 1 1 0 $c_7$ 0 $c_8$ 0 1 1 0 1 |

The bold pattern within the prohibited pattern c is used to detect violations during the third stage of encoding whereas the bold pattern in the substitute pattern y or z (if the presence of channel errors is considered, then y, the output of the third encoder stage 206, becomes z, the input of the first decoder stage 212) is used to detect required inverse substitution during the first stage of decoding. If none of the two prohibited patterns is detected during the third encoder stage 206, the output of the third encoder stage 206 is equal to its input, i.e., y=c. Therefore, there are three partitions (two substitutions plus absence of substitution) in the third encoder stage 206.

The constraints satisfied by $o_1^E = b^T = [b_1\ b_2 \ldots b_{17}]^T$ following the third encoder stage 206 are G Constraints:

$$y_1+y_2+y_3+y_4=1$$

$$y_4+y_5+y_6+y_7+y_8=1$$

$$y_5+y_6+y_7+y_8+y_9+y_{10}=1$$

$$y_6+y_7+y_8+y_9+y_{10}+y_{11}+y_{12}=1$$

$$y_{10}+y_{11}+y_{12}+y_{13}+y_{14}=1$$

$$y_{14}+y_{15}+y_{16}+y_{17}=1$$

I Constraints:

$$y_1+y_3+y_5+y_7=1$$

$$y_2+y_4+y_6+y_8=1$$

$$y_6+y_8+y_{10}+y_{12}=1$$

$$y_7+y_9+y_{11}+y_{13}=1$$

$$y_9+y_{11}+y_{13}+y_{15}=1$$

$$y_{10}+y_{12}+y_{14}=1$$

M Constraints:

$$y_1\ y_2\ y_3\ y_4\ y_5\ y_6\ y_7\ y_8 = 0$$

$$y_9\ y_{10}\ y_{11}\ y_{12}\ y_{13}\ y_{14} = 0$$

Minimum Transition Density Constraints:

$$y_1+y_2+y_3+\bar{y}_4+\bar{y}_5+y_6+y_7+y_8=1$$

$$y_9+y_{10}+y_{11}+y_{12}+\bar{y}_{13}+\bar{y}_{14}+y_{15}+y_{16}+y_{17}=1$$

The code obtained at the output of the third (and last, when k=1, 2, 3) encoding stage is a PRML(G=6, I=7, M=15) code that enforces at least $Q_2=4$ transitions per codeword. The second and third encoder stages 204, 206 may optionally be combined into a single remapping stage of undesired patterns into desired patterns where remapping occurs in a manner allowing the inverse operation during decoding.

Decoding

FIG. 2B is a block diagram of the decoder 210. The decoder 210 receives rate-16/17 PRML(G=6, I=7, M=15) encoded data z(1:17) and, using k encoding stages, outputs unencoded user data f(1:16). The example of the decoder 210 which is illustrated and described herein includes K=3 decoding stages 212, 214, 216, although more or fewer stages may be used. The three stages 212, 214, 216, provide the inverse of the operations performed at the encoding stages: the first decoder stage 212 inverts the third encoder stage 206, the second decoder stage 214 inverts the second encoder stage 204 and the third decoder stage 216 inverts the first encoder stage 202. The output of the k-th decoding stage $o_k^D$ (binary column vector) may be described by the multiplication of a binary transformation matrix $M_k^D = g_k^D(i_k^D)$ and a binary partitioning vector $n_k^D = h_k^D(i_k^D)$ (binary column vector) that depend on the binary input $i_k^D$ (binary column vector)

$$o_k^D = M_k^D n_k^D = g_k^D(i_k^d) h_k^D(i_k^D)$$

where the superscript D refers to the decoding operation. Finally, concatenation of decoding stages is done such that the output of the k-th decoding stage, k=1, 2 (in general, k=1, . . . , K−1) is the input of the next decoding stage, i.e., $i_{k+1}^D = o_k^D$.

As will be shown in the section on implementing the rate-16/17 encoder and decoder, the encoder and decoder may be implemented with few two-input gates. All of the Boolean equations for encoding and decoding are the result of multiplication of a specific matrix and a partitioning column vector that are specified in the next two sections.

Matrix-Vector Description of Encoding Stages for Rate-16/17 PRML(G=6, I=7, M=15) Code with Minimum Transition Density In this section, the encoding of 16 bits to 17 bits, that is the generation of codewords of the mother code, is fully described using a matrix-vector notation. A compact representation of all three encoding stages 202, 204, 206 is presented. Sixteen input bits a(1) . . . a(16) are input to the first encoder stage 202, then processed through each of the stages described below to produce the 17-bit mother code output bits y(1) . . . y(17) at the third level encoder output. The final step to creating the 33-bit or 49-bit codeword is interleaving the 17-bit encoder output with either 16 or 32 uncoded bits. This final step is briefly described in the last three sections.

Encoding Stage 1:

Input column vector: $i_1^{E=aT} = [a_1 \ a_2 \ \ldots \ a_{16}]^T$

Transformation matrix: $M_1^E = g_1^E(i_1^E) = [M_{1,1}^E \ M_{1,2}^E]$ $$M_{1,1}^E = \begin{bmatrix} a_9 & a_1 & a_1 & a_1 & a_1 & a_1 & a_9 & a_1 & a_5 & a_5 & a_5 & a_5 & a_1 & a_1 & a_1 & a_1 \\ a_{10} & a_2 & a_2 & a_2 & a_2 & a_2 & a_{10} & a_2 & a_6 & a_6 & a_6 & a_6 & a_2 & a_2 & a_2 & a_2 \\ a_{11} & a_3 & a_3 & a_3 & a_3 & a_3 & a_{11} & a_3 & a_7 & a_7 & a_7 & a_7 & a_3 & a_3 & a_3 & a_3 \\ a_{12} & a_4 & a_4 & a_4 & a_4 & a_4 & a_{12} & a_4 & a_8 & a_8 & a_8 & a_8 & a_4 & a_4 & a_4 & a_4 \\ a_5 & a_9 & a_5 & a_5 & a_5 & a_5 & 0 & 0 & 0 & 0 & 0 & 0 & 1 & 1 & 1 \\ a_6 & a_{10} & a_6 & a_6 & a_6 & a_6 & 0 & 0 & 0 & 1 & 1 & 1 & 1 & 0 & 0 & 0 \\ a_7 & a_{11} & a_7 & a_7 & a_7 & a_7 & 0 & 1 & 1 & 0 & 0 & 1 & 1 & 0 & 0 & 1 \\ a_8 & a_{12} & a_8 & a_8 & a_8 & a_8 & 1 & 0 & 1 & 0 & 1 & 0 & 1 & 0 & 1 & 0 \\ 0 & 0 & 0 & 1 & 1 & 1 & 1 & 1 & 1 & 1 & 1 & 1 & 1 & 1 & 1 \\ 1 & 1 & 1 & 1 & 1 & 1 & 1 & 1 & 1 & 1 & 1 & 1 & 1 & 1 & 1 \\ 0 & 1 & 1 & 0 & 0 & 1 & 1 & 1 & 1 & 1 & 1 & 1 & 1 & 1 & 1 \\ 0 & 0 & 0 & 0 & 0 & 0 & 0 & 0 & 0 & 0 & 0 & 0 & 0 & 0 & 0 \\ 1 & 0 & 1 & 0 & 1 & 0 & 1 & 1 & 1 & 1 & 1 & 1 & 1 & 1 & 1 \\ a_{13} & a_{13} & a_{13} & a_{13} & a_{13} & a_9 & a_{13} & a_9 & a_9 & a_{13} & a_{13} & a_{13} & a_{13} & a_{13} & a_{13} & a_5 \\ a_{14} & a_{14} & a_{14} & a_{14} & a_{14} & a_{10} & a_{14} & a_{10} & a_{10} & a_{14} & a_{14} & a_{14} & a_{14} & a_{14} & a_{14} & a_6 \\ a_{15} & a_{15} & a_{15} & a_{15} & a_{15} & a_{11} & a_{15} & a_{11} & a_{11} & a_{15} & a_{15} & a_{15} & a_{15} & a_{15} & a_{15} & a_7 \\ a_{16} & a_{16} & a_{16} & a_{16} & a_{16} & a_{12} & a_{16} & a_{12} & a_{12} & a_{16} & a_{16} & a_{16} & a_{16} & a_{16} & a_{16} & a_8 \end{bmatrix}$$

$$M_{1,2}^E = \begin{bmatrix} a_1 & a_1 & 0 & 0 & 0 & 0 & 0 & 0 & 0 & 1 & 1 & 1 & 1 & 1 & 1 & a_1 \\ a_2 & a_2 & 0 & 0 & 0 & 1 & 1 & 1 & 1 & 0 & 0 & 0 & 0 & 1 & 1 & a_2 \\ a_3 & a_3 & 0 & 1 & 1 & 0 & 0 & 1 & 1 & 0 & 0 & 1 & 1 & 0 & 0 & a_3 \\ a_4 & a_4 & 1 & 0 & 1 & 0 & 1 & 0 & 1 & 0 & 1 & 0 & 1 & 0 & 1 & a_4 \\ 1 & 1 & 1 & 1 & 1 & 1 & 1 & 1 & 1 & 1 & 1 & 1 & 1 & 1 & a_5 \\ 0 & 1 & 1 & 1 & 1 & 1 & 1 & 1 & 1 & 1 & 1 & 1 & 1 & 1 & a_6 \\ 1 & 0 & 0 & 0 & 0 & 0 & 0 & 0 & 0 & 0 & 0 & 0 & 0 & 0 & a_7 \\ 1 & 0 & 1 & 1 & 1 & 1 & 1 & 1 & 1 & 1 & 1 & 1 & 1 & 1 & a_8 \\ 1 & 1 & 1 & 1 & 1 & 1 & 1 & 1 & 1 & 1 & 1 & 1 & 1 & 1 & a_9 \\ 1 & 1 & 1 & 1 & 1 & 1 & 1 & 1 & 1 & 1 & 1 & 1 & 1 & 1 & a_{10} \\ 1 & 1 & 1 & 1 & 1 & 1 & 1 & 1 & 1 & 1 & 1 & 1 & 1 & 1 & a_{11} \\ 0 & 0 & 0 & 0 & 0 & 0 & 0 & 0 & 0 & 0 & 0 & 0 & 0 & 0 & 1 \\ 1 & 1 & 1 & 1 & 1 & 1 & 1 & 1 & 1 & 1 & 1 & 1 & 1 & 1 & a_{12} \\ a_5 & a_5 & a_9 & a_{13} & a_{13} & a_{13} & a_5 & a_5 & a_5 & a_1 & a_1 & a_1 & 0 & 0 & 0 & a_{13} \\ a_6 & a_6 & a_{10} & a_{14} & a_{14} & a_{14} & a_6 & a_6 & a_6 & a_2 & a_2 & a_2 & 0 & 0 & 0 & a_{14} \\ a_7 & a_7 & a_{11} & a_{15} & a_{15} & a_7 & a_7 & a_7 & a_7 & a_3 & a_3 & a_3 & 1 & 1 & 1 & a_{15} \\ a_8 & a_8 & a_{12} & a_{16} & a_{16} & a_{16} & a_8 & a_8 & a_8 & a_4 & a_4 & a_4 & 1 & 1 & 1 & a_{16} \end{bmatrix}$$

Partitioning column vector: $n_1^E = h_1^E(i_1^E) = p^T = [p_1\ p_2 \ldots p_{32}]^T$ where the following six auxiliary variables:

$$v_1 = \overline{a_1 + a_2 + a_3 + a_4}$$

$$v_2 = \overline{a_5 + a_6 + a_7 + a_8}$$

$$v_3 = \overline{a_9 + a_{10} + a_{11} + a_{12}}$$

$$v_4 = \bar{a}_9 + a_{10} + \bar{a}_{11} + \bar{a}_{12}$$

$$v_5 = a_9 + a_{10} + a_{11} + a_{12}$$

$$v_6 = \overline{a_{13} + a_{14} + a_{15} + a_{16}}$$

are used to express the components of the partitioning vector:

$$p_1 = v_1 \bar{v}_2 \bar{v}_3 \bar{v}_4 \bar{v}_5 \bar{v}_6,$$
$$p_2 = \bar{v}_1 v_2 \bar{v}_3 \bar{v}_4 \bar{v}_5 \bar{v}_6,$$
$$p_3 = \bar{v}_1 \bar{v}_2 v_3 \bar{v}_4 \bar{v}_5 \bar{v}_6,$$
$$p_4 = \bar{v}_1 \bar{v}_2 \bar{v}_3 v_4 \bar{v}_5 \bar{v}_6,$$
$$p_5 = \bar{v}_1 \bar{v}_2 \bar{v}_3 \bar{v}_4 v_5 \bar{v}_6,$$
$$p_6 = \bar{v}_1 \bar{v}_2 \bar{v}_3 \bar{v}_4 \bar{v}_5 v_6,$$
$$p_7 = v_1 v_2 \bar{v}_3 \bar{v}_4 \bar{v}_5 \bar{v}_6,$$
$$p_8 = \bar{v}_1 v_2 v_3 \bar{v}_4 \bar{v}_5 \bar{v}_6,$$
$$p_9 = v_1 \bar{v}_2 v_3 \bar{v}_4 \bar{v}_5 \bar{v}_6,$$
$$p_{10} = v_1 \bar{v}_2 \bar{v}_3 v_4 \bar{v}_5 \bar{v}_6,$$
$$p_{11} = v_1 \bar{v}_2 \bar{v}_3 \bar{v}_4 v_5 \bar{v}_6,$$
$$p_{12} = v_1 \bar{v}_2 \bar{v}_3 \bar{v}_4 \bar{v}_5 v_6,$$
$$p_{13} = \bar{v}_1 v_2 v_3 \bar{v}_4 \bar{v}_5 \bar{v}_6,$$
$$p_{14} = \bar{v}_1 v_2 \bar{v}_3 v_4 \bar{v}_5 \bar{v}_6,$$
$$p_{15} = \bar{v}_1 v_2 \bar{v}_3 \bar{v}_4 v_5 \bar{v}_6,$$
$$p_{16} = \bar{v}_1 v_2 \bar{v}_3 \bar{v}_4 \bar{v}_5 v_6,$$
$$p_{17} = \bar{v}_1 \bar{v}_2 v_3 v_4 \bar{v}_5 \bar{v}_6,$$
$$p_{18} = \bar{v}_1 \bar{v}_2 v_3 \bar{v}_4 v_5 \bar{v}_6,$$
$$p_{19} = \bar{v}_1 \bar{v}_2 v_3 \bar{v}_4 \bar{v}_5 v_6,$$
$$p_{20} = \bar{v}_1 \bar{v}_2 \bar{v}_3 v_4 v_5 \bar{v}_6,$$
$$p_{21} = \bar{v}_1 \bar{v}_2 \bar{v}_3 v_4 \bar{v}_5 v_6,$$
$$p_{22} = \bar{v}_1 \bar{v}_2 \bar{v}_3 \bar{v}_4 v_5 v_6,$$
$$p_{23} = v_1 v_2 v_3 \bar{v}_4 \bar{v}_5 \bar{v}_6,$$
$$p_{24} = v_1 v_2 \bar{v}_3 v_4 \bar{v}_5 \bar{v}_6,$$
$$p_{25} = \bar{v}_1 v_2 v_3 \bar{v}_4 v_5 \bar{v}_6,$$
$$p_{26} = \bar{v}_1 v_2 v_3 \bar{v}_4 \bar{v}_5 v_6,$$
$$p_{27} = v_1 \bar{v}_2 v_3 v_4 \bar{v}_5 \bar{v}_6,$$
$$p_{28} = \bar{v}_1 \bar{v}_2 v_3 v_4 \bar{v}_5 v_6,$$
$$p_{29} = v_1 v_2 \bar{v}_3 \bar{v}_4 v_5 \bar{v}_6,$$
$$p_{30} = v_1 \bar{v}_2 v_3 \bar{v}_4 v_5 \bar{v}_6,$$
$$p_{31} = v_1 v_2 \bar{v}_3 \bar{v}_4 \bar{v}_5 v_6,$$
$$p_{32} = \bar{v}_1 v_2 \bar{v}_3 v_4 \bar{v}_5 v_6,$$

Output column vector: $o_1^E = M_1^E n_1^E = b^T = [b_1\ b_2 \ldots b_{17}]^T$

Encoding Stage 2:
  Input column vector: $i_2^E = b^T = [b_1\ b_2 \ldots b_{17}]^T$
  Transformation matrix: $M_2^E = g_2^E(i_2^E)$ $$M_2^E = \begin{bmatrix} b_2 & 0 & b_4 & b_{14} & b_6 & b_{10} & b_8 & b_{12} & b_9 & 0 & b_{11} & 0 & b_{12} & 1 & b_{15} & b_{16} & b_{17} \\ b_{14} & 1 & b_9 & b_{15} & b_{11} & b_{10} & b_{13} & b_{12} & b_1 & 0 & b_3 & 0 & b_5 & 1 & b_7 & b_{16} & b_{17} \\ b_{14} & b_{15} & 1 & b_9 & b_{10} & b_{11} & b_{12} & b_{13} & 1 & 1 & 1 & 1 & 1 & 0 & 1 & b_{16} & b_{17} \\ b_1 & b_2 & b_3 & b_4 & b_5 & b_6 & b_7 & b_8 & b_9 & b_{10} & b_{11} & b_{12} & b_{13} & b_{14} & b_{15} & b_{16} & b_{17} \end{bmatrix}^T$$

Partitioning column vector: $n_2^E = h_2^E(i_2^E) = q^T = [q_1\ q_2\ q_3\ q_4]^T$ where $$q_1 = \overline{b_1 + b_3 + b_5 + b_7}$$

$$q_2 = \overline{b_2 + b_4 + b_6 + b_8}$$

$$q_3 = b_1\ b_2\ b_3\ b_4\ b_5\ b_6\ b_7\ b_8$$

$$q_4 = \overline{q_1 + q_2 + q_3}$$

Output column vector: $o_2^E = M_2^E n_2^E = c^T = [c_1\ c_2 \ldots c_{17}]^T$

Encoding Stage 3:
  Input column vector: $i_3^E = c^T = [c_1\ c_2 \ldots c_{17}]^T$
  Transformation matrix: $M_3 E = g_3 E(i_3 E)$ $$M_3^E = \begin{bmatrix} c_{10} & c_{12} & 1 & 1 & 0 & 0 & 0 & 0 & c_9 & 1 & c_{11} & 0 & c_{13} & c_{14} & c_{15} & c_{16} & c_{17} \\ c_1 & c_2 & c_3 & c_4 & c_5 & c_6 & 1 & 1 & 0 & c_7 & 0 & c_8 & 0 & 1 & 1 & 0 & 1 \\ c_1 & c_2 & c_3 & c_4 & c_5 & c_6 & c_7 & c_8 & c_9 & c_{10} & c_{11} & c_{12} & c_{13} & c_{14} & c_{15} & c_{16} & c_{17} \end{bmatrix}^T$$

Partitioning column vector: $n_3^E = h_3^E = h_3^E(i_3^E) = u^T = [u_1\ u_2\ u_3]^T$ where $$u_1 = \bar{c}_1 \bar{c}_2 c_3\ c_4\ c_5 \bar{c}_6 \bar{c}_7 \bar{c}_8$$

$$u_2 = \bar{c}_9 \bar{c}_{10} \bar{c}_{11} \bar{c}_{12}\ c_{13}\ c_{14} \bar{c}_{15} \bar{c}_{16} \bar{c}_{17}$$

$$u_3 = \overline{u_1 + u_2}$$

Output column vector: $o_3^E = M_3^E n_3^E = y^T = [y_1\ y_2 \ldots y_{17}]T$

Matrix-Vector Description of Decoding Stages for Rate-16/17 PRML(G=6, I=7, M=15) Code with Minimum Transition Density In this section, decoding 17-bits to 16-bits is described using matrix-vector notation. A compact representation of all three decoding stages 212, 214, 216 is presented. Seventeen input bits $z(1) \ldots z(17)$ are input to the first decoder stage 212, then processed through each of the stages described below to produce the 16-bit output bits $f(1) \ldots f(16)$ at the output f of the third decoder stage 216. The final step to creating the 32-bit or 48-bit dataword is interleaving the 16-bit output of the decoder 210 with either 16 or 32 uncoded bits. This final step is briefly described in the last three sections.

Decoding Stage 1:
  Input column vector: $i_1^D = z^T = [z_1 \ z_2 \ \ldots \ z_{17}]^T$
  Transformation matrix: $M_1^D = g_1^D(i_1^D)$ $$M_1^D = \begin{bmatrix} 0 & 0 & 0 & 1 & 1 & 0 & 0 & 0 & z_9 & z_1 & z_{11} & z_2 & z_{13} & z_{14} & z_{15} & z_{16} & z_{17} \\ z_1 & z_2 & z_3 & z_4 & z_5 & z_6 & z_{10} & z_{12} & 0 & 0 & 0 & 0 & 1 & 1 & 0 & 0 & 0 \\ z_1 & z_2 & z_3 & z_4 & z_5 & z_6 & z_7 & z_8 & z_9 & z_{10} & z_{11} & z_{12} & z_{13} & z_{14} & z_{15} & z_{16} & z_{17} \end{bmatrix}^T$$

Partitioning column vector: $n_1^D = h_1^D(i_1^D) = w' = [w_1 \ w_2 \ w_3]^T$
where $w_1 = z_3 \ z_4 \bar{z}_5 \bar{z}_6 \bar{z}_7 \bar{z}_8 \ z_{10} \bar{z}_{12}$ $w_2 = z_7 \ z_8 \bar{z}_9 \bar{z}_{11} \bar{z}_{13} \ z_{14} \ z_{15} \bar{z}_{16} \ z_{17}$ $w_3 = \overline{w_1 + w_2}$ Output column vector: $o_1^D = M_1^D n_1^D = d^T = [d_1 \ d_2 \ \ldots \ d_{17}]^T$ Decoding Stage 2:
  Input column vector: $i_2^D = d^T = [d_1 \ d_2 \ \ldots \ d_{17}]^T$
  Transformation matrix: $M_2^D = g_2^D(i_2^D)$ $$M_2^D = \begin{bmatrix} 0 & d_1 & 0 & d_3 & 0 & d_5 & 0 & d_7 & d_9 & d_6 & d_{11} & d_8 & d_{13} & d_4 & d_{15} & d_{16} & d_{17} \\ d_9 & 0 & d_{11} & 0 & d_{13} & 0 & d_{15} & 0 & d_3 & d_6 & d_5 & d_8 & d_7 & d_1 & d_4 & d_{16} & d_{17} \\ 1 & 1 & 1 & 1 & 1 & 1 & 1 & 1 & d_4 & d_5 & d_6 & d_7 & d_8 & d_1 & d_2 & d_{16} & d_{17} \\ d_1 & d_2 & d_3 & d_4 & d_5 & d_6 & d_7 & d_8 & d_9 & d_{10} & d_{11} & d_{12} & d_{13} & d_{14} & d_{15} & d_{16} & d_{17} \end{bmatrix}$$

Partitioning column vector: $n_2^D = h_2^D(i_2^D) = r^T = [r_1 \ r_2 \ r_3 \ r_4]^T$
where $r_1 = \bar{d}_2 \bar{d}_{10} \bar{d}_{12} \ d_{14}$ $r_2 = d_2 \bar{d}_{10} \bar{d}_{12} \ d_{14}$ $r_3 = d_3 \ d_9 \ d_{10} \ d_{11} \ d_{12} \ d_{13} \bar{d}_{14} \ d_{15}$ $r_4 = \overline{r_1 + r_2 + r_3}$ Output column vector: $o_2^D = M_2^D n_2^D = e^T = [e_1 \ e_2 \ \ldots \ e_{17}]^T$ Decoding Stage 3:
  Input column vector: $i_3^D = e^T = [e_1 \ e_2 \ \ldots \ e_{17}]^T$
  Transformation matrix: $M_3^D = g_3^D(i_3^D) = [M_{3,1}^D \ M_{3,2}^D]$ $$M_{3,1}^D = \begin{bmatrix} 0 & e_1 & e_1 & e_1 & e_1 & e_1 & 0 & e_1 & 0 & 0 & 0 & 0 & e_1 & e_1 & e_1 & e_1 \\ 0 & e_2 & e_2 & e_2 & e_2 & e_2 & 0 & e_2 & 0 & 0 & 0 & 0 & e_2 & e_2 & e_2 & e_2 \\ 0 & e_3 & e_3 & e_3 & e_3 & e_3 & 0 & e_3 & 0 & 0 & 0 & 0 & e_3 & e_3 & e_3 & e_3 \\ 0 & e_4 & e_4 & e_4 & e_4 & e_4 & 0 & e_4 & 0 & 0 & 0 & 0 & e_4 & e_4 & e_4 & e_4 \\ e_5 & e_5 & e_5 & e_5 & e_5 & e_5 & 0 & 0 & e_1 & e_1 & e_1 & e_1 & 0 & 0 & 0 & e_{14} \\ e_6 & e_6 & e_6 & e_6 & e_6 & e_6 & 0 & 0 & e_2 & e_2 & e_2 & e_2 & 0 & 0 & 0 & e_{15} \\ e_7 & e_7 & e_7 & e_7 & e_7 & e_7 & 0 & 0 & e_3 & e_3 & e_3 & e_3 & 0 & 0 & 0 & e_{16} \\ e_8 & e_8 & e_8 & e_8 & e_8 & e_8 & 0 & 0 & e_4 & e_4 & e_4 & e_4 & 0 & 0 & 0 & e_{17} \\ e_1 & e_5 & 0 & 0 & 1 & e_{14} & e_1 & e_{14} & e_{14} & 0 & 0 & 1 & 0 & 0 & 1 & 0 \\ e_2 & e_6 & 0 & 1 & 1 & e_{15} & e_2 & e_{15} & e_{15} & 0 & 1 & 1 & 0 & 1 & 1 & 0 \\ e_3 & e_7 & 0 & 0 & 1 & e_{16} & e_3 & e_{16} & e_{16} & 0 & 0 & 1 & 0 & 0 & 1 & 0 \\ e_4 & e_8 & 0 & 0 & 1 & e_{17} & e_4 & e_{17} & e_{17} & 0 & 0 & 1 & 0 & 0 & 1 & 0 \\ e_{14} & e_{14} & e_{14} & e_{14} & e_{14} & 0 & e_{14} & 0 & 0 & e_{14} & e_{14} & e_{14} & e_{14} & e_{14} & e_{14} & 0 \\ e_{15} & e_{15} & e_{15} & e_{15} & e_{15} & 0 & e_{15} & 0 & 0 & e_{15} & e_{15} & e_{15} & e_{15} & e_{15} & e_{15} & 0 \\ e_{16} & e_{16} & e_{16} & e_{16} & e_{16} & 0 & e_{16} & 0 & 0 & e_{16} & e_{16} & e_{16} & e_{16} & e_{16} & e_{16} & 0 \\ e_{17} & e_{17} & e_{17} & e_{17} & e_{17} & 0 & e_{17} & 0 & 0 & e_{17} & e_{17} & e_{17} & e_{17} & e_{17} & e_{17} & 0 \end{bmatrix}$$

$$M_{3,2}^D = \begin{bmatrix} e_1 & e_1 & 0 & 0 & 0 & 0 & 0 & 0 & 0 & e_{14} & e_{14} & e_{14} & 0 & 0 & 0 & e_1 \\ e_2 & e_2 & 0 & 0 & 0 & 0 & 0 & 0 & 0 & e_{15} & e_{15} & e_{15} & 0 & 0 & 0 & e_2 \\ e_3 & e_3 & 0 & 0 & 0 & 0 & 0 & 0 & 0 & e_{16} & e_{16} & e_{16} & 0 & 0 & 0 & e_3 \\ e_4 & e_4 & 0 & 0 & 0 & 0 & 0 & 0 & 0 & e_{17} & e_{17} & e_{17} & 0 & 0 & 0 & e_4 \\ e_{14} & e_{14} & 0 & 0 & 0 & 0 & e_{14} & e_{14} & e_{14} & 0 & 0 & 0 & 0 & 0 & 0 & e_5 \\ e_{15} & e_{15} & 0 & 0 & 0 & 0 & e_{15} & e_{15} & e_{15} & 0 & 0 & 0 & 0 & 0 & 0 & e_6 \\ e_{16} & e_{16} & 0 & 0 & 0 & 0 & e_{16} & e_{16} & e_{16} & 0 & 0 & 0 & 0 & 0 & 0 & e_7 \\ e_{17} & e_{17} & 0 & 0 & 0 & 0 & e_{17} & e_{17} & e_{17} & 0 & 0 & 0 & 0 & 0 & 0 & e_8 \\ 0 & 1 & e_{14} & 0 & 0 & 1 & 0 & 0 & 0 & 0 & 0 & 1 & 0 & 0 & 1 & e_9 \\ 1 & 1 & e_{15} & 0 & 1 & 1 & 0 & 1 & 0 & 0 & 1 & 1 & 0 & 1 & 1 & e_{10} \\ 0 & 1 & e_{16} & 0 & 0 & 1 & 0 & 0 & 0 & 0 & 0 & 1 & 0 & 0 & 1 & e_{11} \\ 0 & 1 & e_{17} & 0 & 0 & 1 & 0 & 0 & 0 & 0 & 0 & 1 & 0 & 0 & 1 & e_{13} \\ 0 & 0 & 0 & e_{14} & e_{14} & e_{14} & 0 & 0 & 0 & 0 & 0 & 0 & 0 & 0 & 0 & e_{14} \\ 0 & 0 & 0 & e_{15} & e_{15} & e_{15} & 0 & 0 & 0 & 0 & 0 & 0 & 0 & 0 & 0 & e_{15} \\ 0 & 0 & 0 & e_{16} & e_{16} & e_{16} & 0 & 0 & 0 & 0 & 0 & 0 & 0 & 0 & 0 & e_{16} \\ 0 & 0 & 0 & e_{17} & e_{17} & e_{17} & 0 & 0 & 0 & 0 & 0 & 0 & 0 & 0 & 0 & e_{17} \end{bmatrix}$$

Partitioning column vector: $n_3^D = h_3^D(i_3^D) = s^T = [s_1\ s_2\ \ldots\ s_{32}]^T$ where $s_1 = \bar{e}_9 e_{10} \bar{e}_{11} \bar{e}_{12} e_{13}$, $s_2 = \bar{e}_9 e_{10} e_{11} \bar{e}_{12} \bar{e}_{13}$, $s_3 = \bar{e}_9 e_{10} e_{11} \bar{e}_{12} e_{13}$, $s_4 = e_9 e_{10} \bar{e}_{11} \bar{e}_{12} e_{13}$, $s_5 = e_9 e_{10} \bar{e}_{11} \bar{e}_{12} e_{13}$, $s_6 = e_9 e_{10} e_{11} \bar{e}_{12} \bar{e}_{13}$, $s_7 = \bar{e}_5 \bar{e}_6 \bar{e}_7 e_8 e_9 e_{10} e_{11} \bar{e}_{12} e_{13}$, $s_8 = \bar{e}_5 \bar{e}_6 e_7 \bar{e}_8 e_9 e_{10} e_{11} \bar{e}_{12} e_{13}$, $s_9 = \bar{e}_5 \bar{e}_6 e_7 e_8 e_9 e_{10} e_{11} \bar{e}_{12} e_{13}$, $s_{10} = \bar{e}_5 e_6 \bar{e}_7 e_8 e_9 e_{10} e_{11} \bar{e}_{12} e_{13}$, $s_{11} = \bar{e}_5 e_6 e_7 \bar{e}_8 e_9 e_{10} e_{11} \bar{e}_{12} e_{13}$, $s_{12} = \bar{e}_5 e_6 e_7 \bar{e}_8 e_9 e_{10} e_{11} \bar{e}_{12} e_{13}$, $s_{13} = \bar{e}_5 e_6 e_7 e_8 e_9 e_{10} e_{11} \bar{e}_{12} e_{13}$, $s_{14} = e_5 \bar{e}_6 \bar{e}_7 \bar{e}_8 e_9 e_{10} e_{11} \bar{e}_{12} e_{13}$, $s_{15} = e_5 \bar{e}_6 \bar{e}_7 e_8 e_9 e_{10} e_{11} \bar{e}_{12} e_{13}$, $s_{16} = e_5 \bar{e}_6 e_7 \bar{e}_8 e_9 e_{10} e_{11} \bar{e}_{12} e_{13}$, $s_{17} = e_5 \bar{e}_6 e_7 e_8 e_9 e_{10} e_{11} \bar{e}_{12} e_{13}$, $s_{18} = e_5 e_6 \bar{e}_7 \bar{e}_8 e_9 e_{10} e_{11} \bar{e}_{12} e_{13}$, $s_{19} = \bar{e}_1 \bar{e}_2 \bar{e}_3 e_4 e_5 e_6 \bar{e}_7 e_8 e_9 e_{10} e_{11} \bar{e}_{12} e_{13}$, $s_{20} = \bar{e}_1 \bar{e}_2 e_3 \bar{e}_4 e_5 e_6 \bar{e}_7 e_8 e_9 e_{10} e_{11} \bar{e}_{12} e_{13}$, $s_{21} = \bar{e}_1 \bar{e}_2 e_3 \bar{e}_4 e_5 e_6 \bar{e}_7 e_8 e_9 e_{10} e_{11} \bar{e}_{12} e_{13}$, $s_{22} = \bar{e}_1 \bar{e}_2 e_3 e_4 e_5 e_6 \bar{e}_7 e_8 e_9 e_{10} e_{11} \bar{e}_{12} e_{13}$, $s_{23} = \bar{e}_1 e_2 \bar{e}_3 e_4 e_5 e_6 \bar{e}_7 e_8 e_9 e_{10} e_{11} \bar{e}_{12} e_{13}$, $s_{24} = \bar{e}_1 e_2 e_3 \bar{e}_4 e_5 e_6 \bar{e}_7 e_8 e_9 e_{10} e_{11} \bar{e}_{12} e_{13}$, $s_{25} = \bar{e}_1 e_2 e_3 e_4 e_5 e_6 \bar{e}_7 e_8 e_9 e_{10} e_{11} \bar{e}_{12} e_{13}$, $s_{26} = e_1 \bar{e}_2 \bar{e}_3 \bar{e}_4 e_5 e_6 \bar{e}_7 e_8 e_9 e_{10} e_{11} \bar{e}_{12} e_{13}$, $s_{27} = e_1 \bar{e}_2 \bar{e}_3 e_4 e_5 e_6 \bar{e}_7 e_8 e_9 e_{10} e_{11} \bar{e}_{12} e_{13}$, $s_{28} = e_1 \bar{e}_2 e_3 \bar{e}_4 e_5 e_6 \bar{e}_7 e_8 e_9 e_{10} e_{11} \bar{e}_{12} e_{13}$, $s_{29} = e_1 \bar{e}_2 e_3 e_4 e_5 e_6 \bar{e}_7 e_8 e_9 e_{10} e_{11} \bar{e}_{12} e_{13}$, $s_{30} = e_1 e_2 \bar{e}_3 \bar{e}_4 e_5 e_6 \bar{e}_7 e_8 e_9 e_{10} e_{11} \bar{e}_{12} e_{13}$, $s_{31} = e_1 e_2 \bar{e}_3 e_4 e_5 e_6 \bar{e}_7 e_8 e_9 e_{10} e_{11} \bar{e}_{12} e_{13}$, $s_{32} = \overline{\sum_{i=1}^{31} s_i}$, Output column vector: $o_3^D = M_3^D n_3^D = f^T = [f_1\ f_2\ \ldots\ f_{16}]^T$ Boolean Logic for Rate-16/17 PRML(G=6, I=7, M=15) Encoder The encoding of 16-bits to 17-bits to generate the mother code in accordance with the present invention is completely described by the following MATLAB Boolean operations. Sixteen inputs bits a(1) ... a(16) are input to a first encoder stage 202, then processed through each of the following stages described below to produce the 17-bit mother code output bits y(1) ... y(17) at the third level encoder output. The final step to creating the 33-bit or 49-bit codeword is interleaving the 17-bit encoder output with either 16 or 32 uncoded bits and is briefly described in the last three sections. The following Boolean equations describe the first encoder stage 202 with 16-bit input a and 17-bit output b.

Auxiliary Boolean variables:

$v1 = \sim(a(1)|a(2)|a(3)|a(4))$ $v2 = \sim(a(5)|a(6)|a(7)|a(8))$ $v3 = \sim(a(9)|a(10)|a(11)|a(12))$ $v4 = \sim a(9) \& a(10) \& \sim a(11) \& \sim a(12)$ $v5 = a(9) \& a(10) \& a(11) \& a(12)$ $v6 = \sim(a(13)|a(14)|a(15)|a(16))$ First-stage partitions:

$p(1) = v1 \& \sim v2 \& \sim v3 \& \sim v4 \& \sim v5 \& \sim v6$ $p(2) = \sim v1 \& v2 \& \sim v3 \& \sim v4 \& \sim v5 \& \sim v6$ $p(3) = \sim v1 \& \sim v2 \& v3 \& \sim v4 \& \sim v5 \& \sim v6$ $p(4) = \sim v1 \& \sim v2 \& \sim v3 \& v4 \& \sim v5 \& \sim v6$ $p(5) = \sim v1 \& \sim v2 \& \sim v3 \& \sim v4 \& v5 \& \sim v6$ $p(6) = \sim v1 \& \sim v2 \& \sim v3 \& \sim v4 \& \sim v5 \& v6$ $p(7) = v1 \& v2 \& \sim v3 \& \sim v4 \& \sim v5 \& \sim v6$ $p(8) = \sim v1 \& v2 \& \sim v3 \& \sim v4 \& \sim v5 \& v6$ $p(9) = v1 \& \sim v2 \& \sim v3 \& \sim v4 \& \sim v5 \& v6$ $p(10) = v1 \& \sim v2 \& v3 \& \sim v4 \& \sim v5 \& \sim v6$ $p(11) = v1 \& \sim v2 \& \sim v3 \& v4 \& \sim v5 \& \sim v6$ $p(12) = v1 \& \sim v2 \& \sim v3 \& \sim v4 \& v5 \& \sim v6$ $p(13) = \sim v1 \& v2 \& v3 \& \sim v4 \& \sim v5 \& \sim v6$ $p(14) = \sim v1 \& v2 \& \sim v3 \& v4 \& \sim v5 \& \sim v6$ $p(15) = \sim v1 \& v2 \& \sim v3 \& \sim v4 \& v5 \& \sim v6$ $p(16) = \sim v1 \& \sim v2 \& v3 \& \sim v4 \& \sim v5 \& v6$ $p(17) = \sim v1 \& \sim v2 \& \sim v3 \& v4 \& \sim v5 \& v6$ $p(18) = \sim v1 \& \sim v2 \& \sim v3 \& \sim v4 \& v5 \& v6$ $p(19) = v1 \& v2 \& \sim v3 \& \sim v4 \& \sim v5 \& v6$ $p(20) = v1 \& v2 \& v3 \& \sim v4 \& \sim v5 \& \sim v6$ $p(21) = v1 \& v2 \& \sim v3 \& v4 \& \sim v5 \& \sim v6$ $p(22) = v1 \& v2 \& \sim v3 \& \sim v4 \& v5 \& \sim v6$ $p(23) = \sim v1 \& v2 \& v3 \& \sim v4 \& \sim v5 \& v6$ $p(24) = v1 \& \sim v2 \& \sim v3 \& v4 \& v5 \& \sim v6$ $p(25) = v1 \& \sim v2 \& \sim v3 \& v4 \& \sim v5 \& v6$ $p(26) = \sim v1 \& v2 \& v3 \& \sim v4 \& v5 \& \sim v6$ $p(27) = \sim v1 \& v2 \& \sim v3 \& v4 \& \sim v5 \& v6$ $p(28) = \sim v1 \& v2 \& \sim v3 \& \sim v4 \& v5 \& v6$ $p(29) = \sim v1 \& v2 \& v3 \& \sim v4 \& \sim v5 \& v6$ $p(30) = v1 \& v2 \& \sim v3 \& v4 \& v5 \& v6$ $p(31) = v1 \& v2 \& \sim v3 \& \sim v4 \& v5 \& v6$ $p(32) = \sim v1 \& \sim v2 \& \sim v3 \& \sim v4 \& \sim v5 \& \sim v6$ Auxiliary Boolean variables:

$v7 = p(1) | p(7)$ $v8 = p(2) | p(3) | p(4) | p(5) | p(6) | p(8) | p(13) | p(14) | p(15) | p(16) | p(17) | p(18) | p(32)$ $v9 = p(9) | p(10) | p(11) | p(12)$ $v10 = p(1) | p(3) | p(4) | p(5) | p(6) | p(32)$ $v11 = p(14) | p(15) | p(16) | p(17) | p(18)$ $v12 = p(19) | p(20) | p(21) | p(22) | p(23) | p(24) | p(25) | p(26) | p(27) | p(28) | p(29) | p(30) | p(31)$ $v13 = p(10) | p(11) | p(12) | p(13)$ $v14 = p(7) | p(8) | v9 | p(13) | v11 | v12$ $v15 = p(1) | p(2) | p(3) | p(4) | p(5) | p(7) | p(10) | p(11) | p(12) | p(13) | p(14) | p(15) | p(20) | p(21) | p(22) | p(32)$ $v16 = p(6) | p(8) | p(9) | p(19)$ $v17 = p(16) | p(17) | p(18) | p(23) | p(24) | p(25)$ $v18 = p(26) | p(27) | p(28)$ $v19 = p(29) | p(30) | p(31)$

First-stage encoding output:

$b(1) = a(9) \& v7 | a(1) \& v8 | a(5) \& v9 | p(26) | p(27) | p(28) | p(29) | p(30) | p(31)$ $b(2) = a(10) \& v7 | a(2) \& v8 | a(6) \& v9 | p(22) | p(23) | p(24) | p(25) | p(30) | p(31)$ $b(3) = a(11) \& v7 | a(3) \& v8 | a(7) \& v9 | p(20) | p(21) | p(24) | p(25) | p(28) | p(29)$ $b(4) = a(12) \& v7 | a(4) \& v8 | a(8) \& v9 | p(19) | p(21) | p(23) | p(25) | p(27) | p(29) | p(31)$ $b(5) = a(5) \& v10 | a(9) \& p(2) | v11 | v12$ $b(6) = a(6) \& v10 | a(10) \& p(2) | v13 | p(18) | v12$ $b(7) = a(7) \& v10 | a(11) \& p(2) | p(8) | p(9) | p(12) | p(13) | p(16) | p(17)$ $b(8) = a(8) \& v10 | a(12) \& p(2) | p(7) | p(9) | p(11) | p(13) | p(15) | p(17) | v12$ $b(9) = a(9) \& p(32) | p(4) | p(5) | p(6) | v14$ $b(10) = a(10) \& p(32) | p(1) | p(2) | p(3) | p(4) | p(5) | p(6) | v14$ $b(11) = a(11) \& p(32) | p(2) | p(3) | p(6) | v14$ $b(12) = p(32)$ $b(13) = a(12) \& p(32) | p(1) | p(3) | p(5) | v14$ $b(14) = a(13) \& v15 | a(9) \& v16 | a(5) \& v17 | a(1) \& v18$ $b(15) = a(14) \& v15 | a(10) \& v16 | a(6) \& v17 | a(2) \& v18$ $b(16) = a(15) \& v15 | a(11) \& v16 | a(7) \& v17 | a(3) \& v18 | v19$ $b(17) = a(16) \& v15 | a(12) \& v16 | a(8) \& v17 | a(4) \& v18 | v19$

The following Boolean equations describe the second encoder stage 204 with 17-bit input b and 17-bit output c.

Second-Stage Partitions:

$q(1) = \sim(b(1) | b(3) | b(5) | b(7))$ $q(2) = \sim(b(2) | b(4) | b(6) | b(8))$ $q(3) = b(1) \& b(2) \& b(3) \& b(4) \& b(5) \& b(6) \& b(7) \& b(8)$ $q(4) = \sim(q(1) | q(2) | q(3))$ Second-stage encoder remapping output:

$c(1)=b(2)\&q(1)|b(14)\&q(2)|b(14)\&q(3)|b(1)\&q(4)$ $c(2)=q(2)|b(15)\&q(3)|b(2)\&q(4)$ $c(3)=b(4)\&q(1)|b(9)\&q(2)|q(3)|b(3)\&q(4)$ $c(4)=b(14)\&q(1)|b(15)\&q(2)|b(9)\&q(3)|b(4)\&q(4)$ $c(5)=b(6)\&q(1)|b(11)\&q(2)|b(10)\&q(3)|b(5)\&q(4)$ $c(6)=b(10)\&q(1)|b(10)\&q(2)|b(11)\&q(3)|b(6)\&q(4)$ $c(7)=b(8)\&q(1)|b(13)\&q(2)|b(12)\&q(3)|b(7)\&q(4)$ $c(8)=b(12)\&q(1)|b(12)\&q(2)|b(13)\&q(3)|b(8)\&q(4)$ $c(9)=b(9)\&q(1)|b(1)\&q(2)|q(3)|b(9)\&q(4)$ $c(10)=q(3)|b(10)\&q(4)$ $c(11)=b(11)\&q(1)|b(3)\&q(2)|q(3)|b(11)\&q(4)$ $c(12)=q(3)|b(12)\&q(4)$ $c(13)=b(13)\&q(1)|b(5)\&q(2)|q(3)|b(13)\&q(4)$ $c(14)=q(1)|q(2)|b(14)\&q(4)$ $c(15)=b(15)\&q(1)|b(7)\&q(2)|q(3)|b(15)\&q(4)$ $c(16)=b(16)\&q(1)|b(16)\&q(2)|b(16)\&q(3)|b(16)\&q(4)$ $c(17)=b(17)\&q(1)|b(17)\&q(2)|b(17)\&q(3)|b(17)\&q(4)$

The following Boolean equations describe the third encoder stage 206 with 17-bit input c and 17-bit output y.

Third-stage partitions:

$u(1)=\sim c(1)\&\sim c(2)\&\sim c(3)\&c(4)\&c(5)\&\sim c(6)\&\sim c(7)\&\sim c(8)$ $u(2)=\sim c(9)\&\sim c(10)\&\sim c(11)\&\sim c(12)\&c(13)\&c(14)\&\sim c(15)\&\sim c(16)\&\sim c(17)$ $u(3)=\sim(u(1)|u(2))$ Auxiliary Boolean variables:

$v20=u(2)|u(3)$ $v21=u(1)|u(3)$

Third-stage encoder remapping output (encoder output):

$y(1)=c(10)\&u(1)|c(1)\&v20$ $y(2)=c(12)\&u(1)|c(2)\&v20$ $y(3)=u(1)|c(3)\&v20$ $y(4)=u(1)|c(4)\&v20$ $y(5)=c(5)\&v20$ $y(6)=c(6)\&v20$ $y(7)=u(2)|c(7)\&u(3)$ $y(8)=u(2)|c(8)\&u(3)$ $y(9)=c(9)\&v21$ $y(10)=u(1)|c(7)\&u(2)|c(10)\&u(3)$ $y(11)=c(11)\&v21$ $y(12)=c(8)\&u(2)|c(12)\&u(3)$ $y(13)=c(13)\&v21$ $y(14)=c(14)\&v21|u(2)$ $y(15)=c(15)\&v21|u(2)$ $y(16)=c(16)\&v21$ $y(17)=c(17)\&v21|u(2)$

Boolean Logic for Rate-16/17 PRML(G=6, I=7, M=15) Decoder

The following Boolean equations describe the first decoder stage 212 with 17-bit input z and 17-bit output d. The first decoder stage 212 inverts the third encoder stage 206.

First-stage decoder partitions:

$w(1)=z(3)\&z(4)\&\sim z(5)\&\sim z(6)\&\sim z(7)\&\sim z(8)\&z(10)\&\sim z(12)$ $w(2)=z(7)\&z(8)\&\sim z(9)\&\sim z(11)\&\sim z(13)\&z(14)\&z(15)\&\sim z(16)\&z(17)$ $w(3)=\sim(w(1)|w(2))$ Auxiliary Boolean variables:

$t2=w(2)|w(3)$ $t2=w(1)|w(3)$

First-stage decoder remapping output:

$d(1)=z(1)\&t1$ $d(2)=z(2)\&t1$ $d(3)=z(3)\&t1$ $d(4)=w(1)|z(4)\&t1$ $d(5)=w(1)|z(5)\&t1$ $d(6)=z(6)\&t1$ $d(7)=z(10)\&w(2)|z(7)\&w(3)$ $d(8)=z(12)\&w(2)|z(8)\&w(3)$ $d(9)=z(9)\&t2$ $d(10)=z(1)\&w(1)|z(10)\&w(3)$ $d(11)=z(11)\&t2$ $d(12)=z(2)\&w(1)|z(12)\&w(3)$ $d(13)=z(13)\&t2|w(2)$ $d(14)=z(14)\&t2|w(2)$ $d(15)=z(15)\&t2$ $d(16)=z(16)\&t2$ $d(17)=z(17)\&t2$

The following Boolean equations describe the second decoder stage 214 with 17-bit input d and 17-bit output e. The second decoder stage 214 inverts the second encoder stage 204.

Second-stage decoder partitions:

$r(1) = \sim d(2) \& \sim d(10) \& \sim d(12) \& d(14)$ $r(2) = d(2) \& \sim d(110) \& \sim d(12) \& d(14)$ $r(3) = d(3) \& d(9) \& d(110) \& d(1) \& d(12) \& d(13) \& \sim d(14) \& d(15)$ $r(4) = \sim (r(1) | r(2) | r(3))$ Auxiliary Boolean variables:

$t3 = r(1) | r(4)$ $t4 = r(1) | r(2)$

Second-stage decoder remapping output:

$e(1) = d(9) \& r(2) | r(3) | d(1) \& r(4)$ $e(2) = d(1) \& r(1) | r(3) | d(2) \& r(4)$ $e(3) = d(11) \& r(2) | r(3) | d(3) \& r(4)$ $e(4) = d(3) \& r(1) | r(3) | d(4) \& r(4)$ $e(5) = d(13) \& r(2) | r(3) | d(5) \& r(4)$ $e(6) = d(5) \& r(1) | r(3) | d(6) \& r(4)$ $e(7) = d(15) \& r(2) | r(3) | d(7) \& r(4)$ $e(8) = d(7) \& r(1) | r(3) | d(8) \& r(4)$ $e(9) = d(9) \& t3 | d(3) \& r(2) | d(4) \& r(3)$ $e(10) = d(6) \& t4 | d(5) \& r(3) | d(10) \& r(4)$ $e(11) = d(11) \& t3 | d(5) \& r(2) | d(6) \& r(3)$ $e(12) = d(8) \& t4 | d(7) \& r(3) | d(12) \& r(4)$ $e(13) = d(13) \& t3 | d(7) \& r(2) | d(8) \& r(3)$ $e(14) = d(4) \& r(1) | d(1) \& (r(2) | r(3)) | d(14) \& r(4)$ $e(15) = d(15) \& t3 | d(4) \& r(2) | d(2) \& r(3)$ $e(16) = d(16)$ $e(17) = d(17)$

The following Boolean equations describe the third (last) decoding stage with 17-bit input e and 16-bit output f. The third decoder stage 216 inverts the first encoder stage 202. In the absence of channel errors, the 16-bit encoder input is equal to the 16-bit decoder output, i.e., a=f.

Auxiliary Boolean variables:

$t5 = e(9) \& e(10) \& e(11) \& \sim e(12) \& e(13)$ $t6 = e(5) \& e(6) \& \sim e(7) \& e(8) \& t5$ Third-stage decoder partitions:

$s(1) = \sim e(9) \& e(10) \& \sim e(11) \& \sim e(12) \& e(13)$ $s(2) = \sim e(9) \& e(10) \& e(11) \& \sim e(12) \& \sim e(13)$ $s(3) = \sim e(9) \& e(10) \& e(11) \& \sim e(12) \& e(13)$ $s(4) = e(9) \& e(10) \& \sim e(11) \& \sim e(12) \& \sim e(13)$ $s(5) = e(9) \& e(10) \& \sim e(11) \& \sim e(12) \& e(13)$ $s(6) = e(9) \& e(10) \& e(11) \& \sim e(12) \& \sim e(13)$ $s(7) = \sim e(5) \& \sim e(6) \& \sim e(7) \& e(8) \& t5$ $s(8) = \sim e(5) \& \sim e(6) \& e(7) \& \sim e(8) \& t5$ $s(9) = \sim e(5) \& \sim e(6) \& e(7) \& e(8) \& t5$ $s(10) = \sim e(5) \& e(6) \& \sim e(7) \& \sim e(8) \& t5$ $s(11) = e(5) \& e(6) \& \sim e(7) \& e(8) \& t5$ $s(12) = \sim e(5) \& e(6) \& e(7) \& \sim e(8) \& t5$ $s(13) = \sim e(5) \& e(6) \& e(7) \& e(8) \& t5$ $s(14) = e(5) \& \sim e(6) \& \sim e(7) \& \sim e(8) \& t5$ $s(15) = e(5) \& \sim e(6) \& \sim e(7) \& e(8) \& t5$ $s(16) = e(5) \& \sim e(6) \& e(7) \& \sim e(8) \& t5$ $s(17) = e(5) \& \sim e(6) \& e(7) \& e(8) \& t5$ $s(18) = e(5) \& e(6) \& \sim e(7) \& \sim e(8) \& t5$ $s(19) = \sim e(1) \& e(2) \& \sim e(3) \& e(4) \& t6$ $s(20) = \sim e(1) \& \sim e(2) \& e(3) \& \sim e(4) \& t6$ $s(21) = e(1) \& e(2) \& e(3) \& e(4) \& t6$ $s(22) = \sim e(1) \& e(2) \& \sim e(3) \& \sim e(4) \& t6$ $s(23) = \sim e(1) \& e(2) \& \sim e(3) \& e(4) \& t6$ $s(24) = \sim e(1) \& e(2) \& e(3) \& \sim e(4) \& t6$ $s(25) = \sim e(1) \& e(2) \& e(3) \& e(4) \& t6$ $s(26) = e(1) \& \sim e(2) \& \sim e(3) \& \sim e(4) \& t6$ $s(27) = e(1) \& \sim e(2) \& \sim e(3) \& e(4) \& t6$ $s(28) = e(1) \& \sim e(2) \& e(3) \& \sim e(4) \& t6$ $s(29) = e(1) \& \sim e(2) \& e(3) \& e(4) \& t6$ $s(30) = e(1) \& e(2) \& \sim e(3) \& \sim e(4) \& t6$ $s(31) = e(1) \& e(2) \& \sim e(3) \& e(4) \& t6$ Auxiliary Boolean variables:

$t7 = s(3) | s(4) | s(5)$ $t8 = s(6) | t7$ $t9 = s(10) | s(11) | s(12)$ $t10 = s(13) | s(14) | s(15)$ $t11 = s(16) | s(17) | s(18)$ $t12 = s(20) | s(21) | s(22)$ $t13 = s(23) | s(24) | s(25)$ t14=s(26)|s(27)|s(28)

t15=s(1)|s(7)

Last third-stage decoder partition:

s(32)=~(t15|s(2)|t8|s(8)|s(9)|t9|t10|t11|s(19)
|t12|t13|t14|s(29)|s(30)|s(31))

Auxiliary Boolean variables:

t16=s(2)|t8|s(8)|t10|t11|s(32)

t17=s(1)|t8|s(32)

t18=s(9)|t9 t19=t11|t13 t20=s(6)|s(8)|s(9)|s(19)

t21=s(5)|s(12)|s(15)|s(18)|s(22)|s(25)|s(28)|s(31)

t22=t15|s(2)|t7|t9|t10|t12|s(32)

Third-stage decoding output (decoder output):

f(1)=e(1)&t16|e(14)&t14 f(2)=e(2)&t16|e(15)&t14 f(3)=e(3)&t16|e(16)&t14 f(4)=e(4)&t16|e(17)&t14 f(5)=e(5)&t17|e(1)&t18|e(14)&t19 f(6)=e(6)&t17|e(2)&t18|e(15)&t19 f(7)=e(7)&t17|e(3)&t18|e(16)&t19 f(8)=e(8)&t17|e(4)&t18|e(17)&t19 f(9)=e(1)&t15|e(5)&s(2)|t21|e(14)&t20|e(9)&s(32)

f(10)=e(2)&t15|e(6)&s(2)|t21|e(15)&t20|e(10)&s(32)
|s(4)|s(11)|s(14)|s(17)|s(21)|s(24)|s(27)|s(30)

f(11)=e(3)&t15|e(7)&s(2)|t21|e(16)&t20|e(11)&s(32)

f(12)=e(4)&t15|e(8)&s(2)|t21|e(17)&t20|e(13)&s(32)

f(13)=e(14)&t22 f(14)=e(15)&t22 f(15)=e(16)&t22 f(16)=e(17)&t22

The encoder and the decoder may be implemented with a total of 936 two-input AND and OR gates (559 two-input AND gates and 377 two-input OR gates).

Rate-32/33 PRML(G=14, I=11, M=23) Code (RLL 1)

In one embodiment of a rate-32/33 PRML code of the present invention, m=32, n=16, s=8, $Q_1$=2, $P_1$=4, $P_2$=2 and $P_3$=2. The rate-16/17 PRML(G=6, I=7, M=15) mother code with minimum transition density $Q_2$=4 may be used to obtain a rate-32/33 PRML(G=14, I=11, M=23) code by breaking the codewords into $P_3$=2 pieces (8 bits and 9 bits) and inserting (m−n)/s=2 uncoded bytes in between (a coded block of 8 bits or 9 bits is always preceded and followed by an uncoded byte). m and n are both integer multiples of the ECC symbol size s. The rate-16/17 PRML(G=6, I=7, M=15) codewords have either interleaved NRZI representation (not precoded), NRZI representation ($1/(1 \oplus D)$ precoded) or NRZ representation ($1/(1 \oplus D^2)$ precoded) for multiplexing with unencoded data. If the rate-16/17 PRML(G=6, I=7, M=15) codewords are in interleaved NRZI, NRZI or NRZ form then the rate-32/33 PRML code obtained after multiplexing with unencoded data is in interleaved NRZI, NRZI or NRZ form, respectively. In other words, coded data is always precoded using a $1/(1 \oplus D^2)$ precoder. However, uncoded data can be either not precoded at all, $1/(1 \oplus D)$ precoded or $1/(1 \oplus D^2)$ precoded. From an error-rate performance viewpoint, it is preferable to not use any precoding for the uncoded data. However, because $1/(1 \oplus D)$ precoding is already used in conjunction with write equalization in LTO 1-4, it may be therefore more desirable to use $1/(1 \oplus D)$ precoding.

Figure 4:
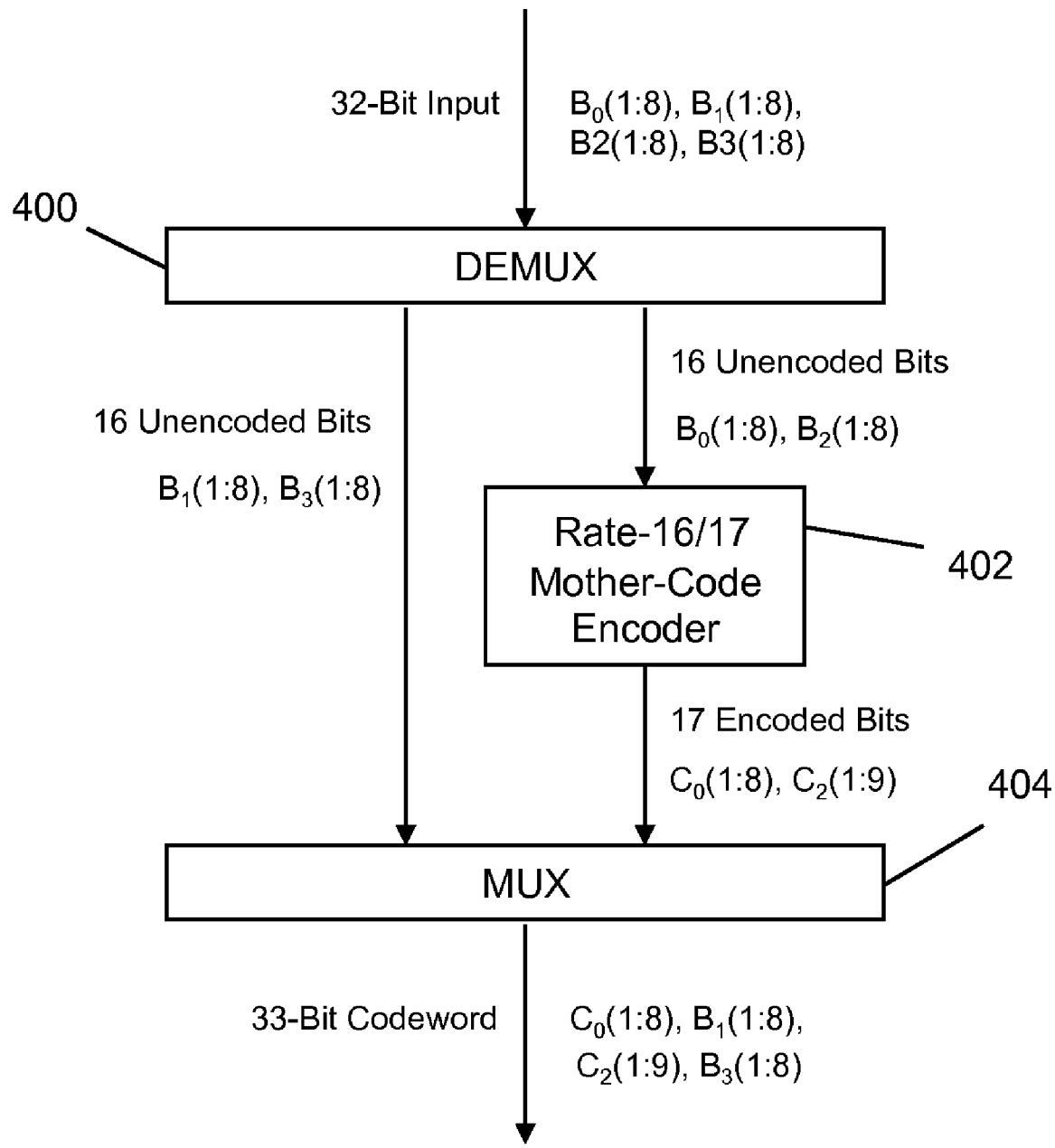
FIG. 4 illustrates the process by which an input of four 8-bit symbols is transformed into a rate-33-bit codeword for a 32/33 code by multiplexing coded and uncoded bits.

FIG. 4 illustrates the process by which a 32-bit input, comprising four s=8-bit error correction coding (ECC) symbols B0(1:8), B1(1:8), B2(1:8), B3(1:8), is transformed into a 33-bit codeword C0(1:8), B1(1:8), C2(1:9), B3(1:8) for the rate-32/33 code by multiplexing coded and uncoded bits. The 32-bit input is separated by a demultiplexer 400 into two sets of two 8-bit symbols B0(1:8), B2(1:8) and B1(1:8), B3(1:8). 16 bits in one of the sets, B0(1:8) and B2(1:8) for example, are encoded by the rate-16/17 mother code encoder 402 which outputs 17 encoded bits C0(1:8), C2(1:9). The 16 bits in the other set, B1(1:8), B3(1:8), remain unencoded. A multiplexer 404 multiplexes the four 8-bit symbols into a 33-bit codeword C0(1:8), B1(1:8), C2(1:9), B3(1:8). Although not illustrated in the Figures, a 48-bit input is transformed into a 49-bit codeword by a comparable process.

Figure 5A:
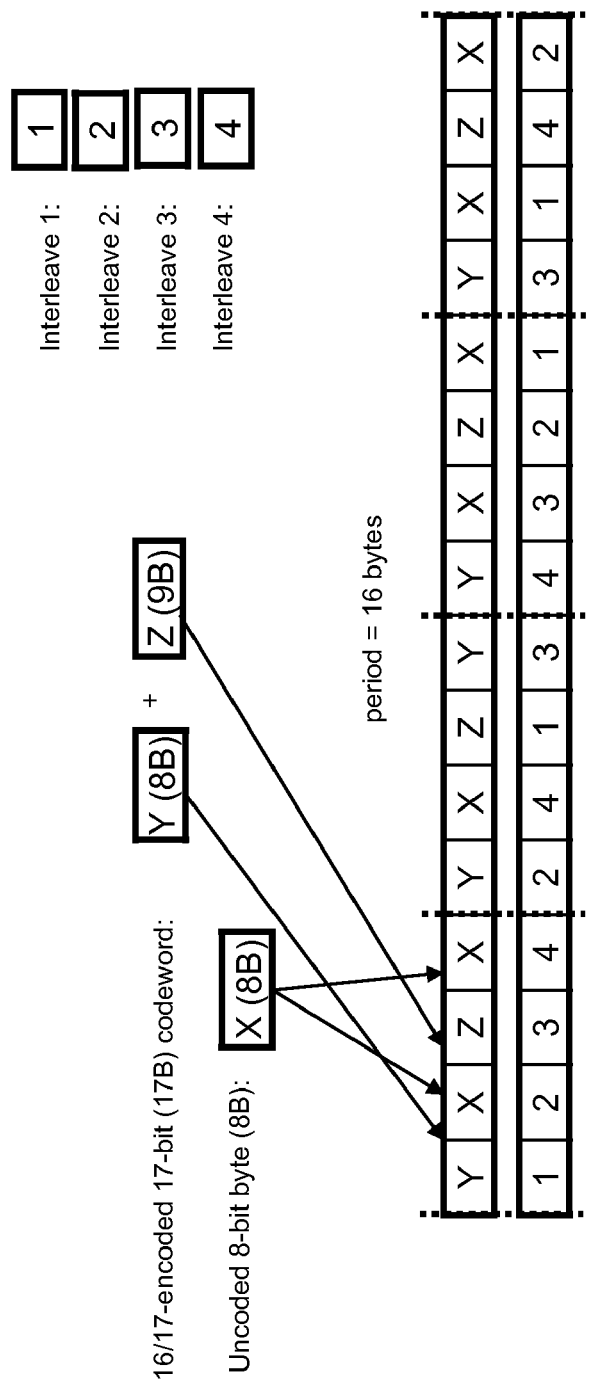
FIGS. 5A, 5B illustrate a 4-way interleaving (multiplexing) scheme of 8-bit symbols at the output of four C1 Reed-Solomon encoders which may be implemented for the rate-32/33 PRML(G=14, I=11, M=23) code of the present invention.
Figure 5B:
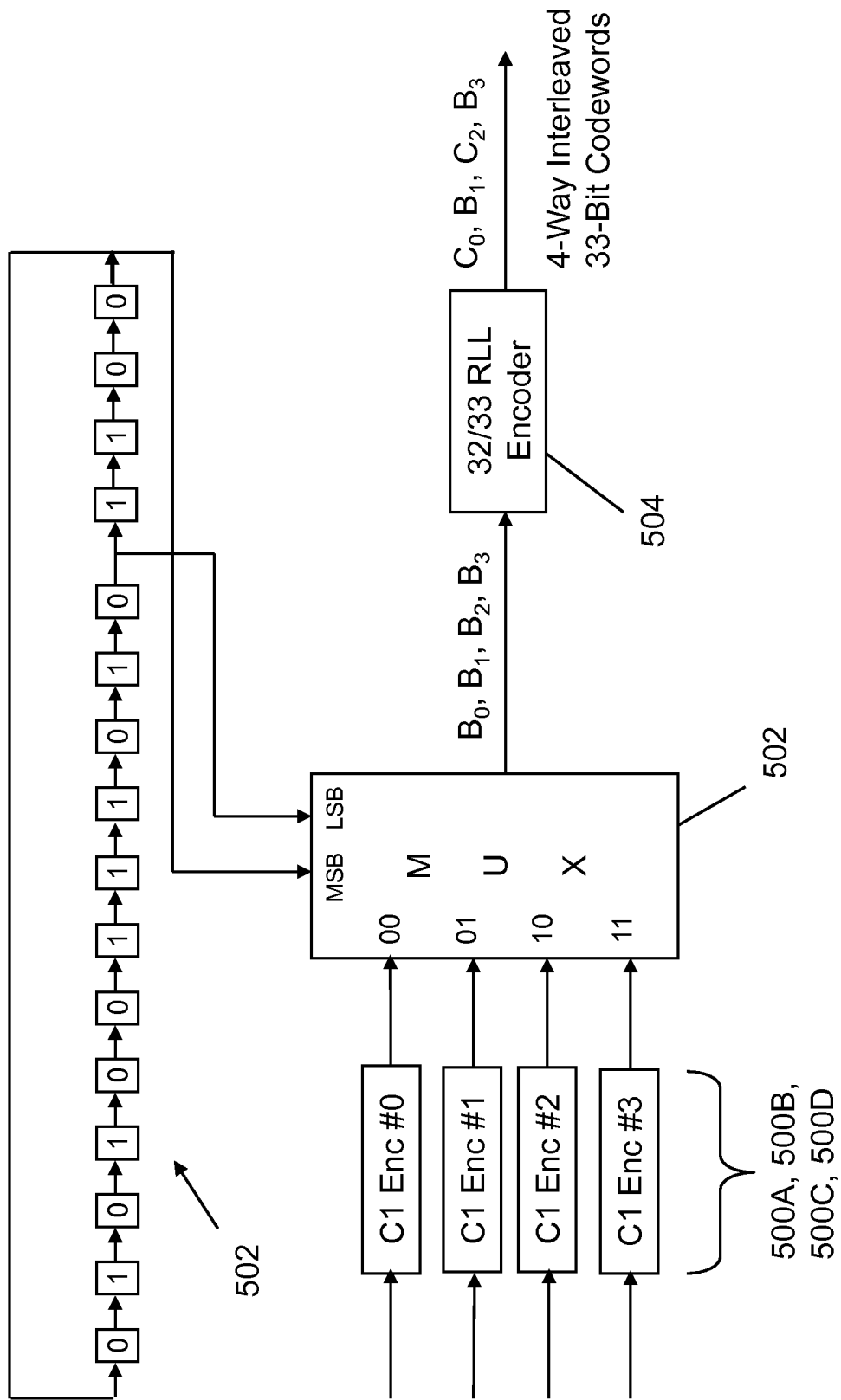

The rate-32/33 PRML(G=14, I=11, M=23) code rules out both DSS and Re Sync and has an error propagation of 8 NRZ bits assuming 4-way C1 interleaving. FIG. 5A illustrates a 4-way interleaving (multiplexing) mechanism of 8-bit symbols at the output of four C1 Reed-Solomon encoders which may be implemented for the rate-32/33 PRML(G=14, I=11, M=23) code of the present invention. FIG. 5B is a block diagram of such an interleaving scheme. Four C1 encoders 500A, 500B, 500C, 500D process separate inputs and their outputs input into a multiplexer 502. The least and most significant bits of a sequence of bits 502 is also input into the multiplexer 502. The output of the multiplexer 502 B0, B1, B2, B3 provides a 32-bit input to a rate-32/33 RLL encoder 504. These four s=8-bit symbols are encoded by the encoder 504 (in the manner illustrated in FIG. 4) and the 4-way interleaved 33-bit codeword, C0, B1, C2, B3, is output. Although not illustrated in the Figures, the block diagram illustrating an interleaving mechanism for the rate-48/49 code would include comparable functional blocks.

Rate-48/49 PRML(G=22, I=15, M=31) Code (RLL 2)

Figure 6:
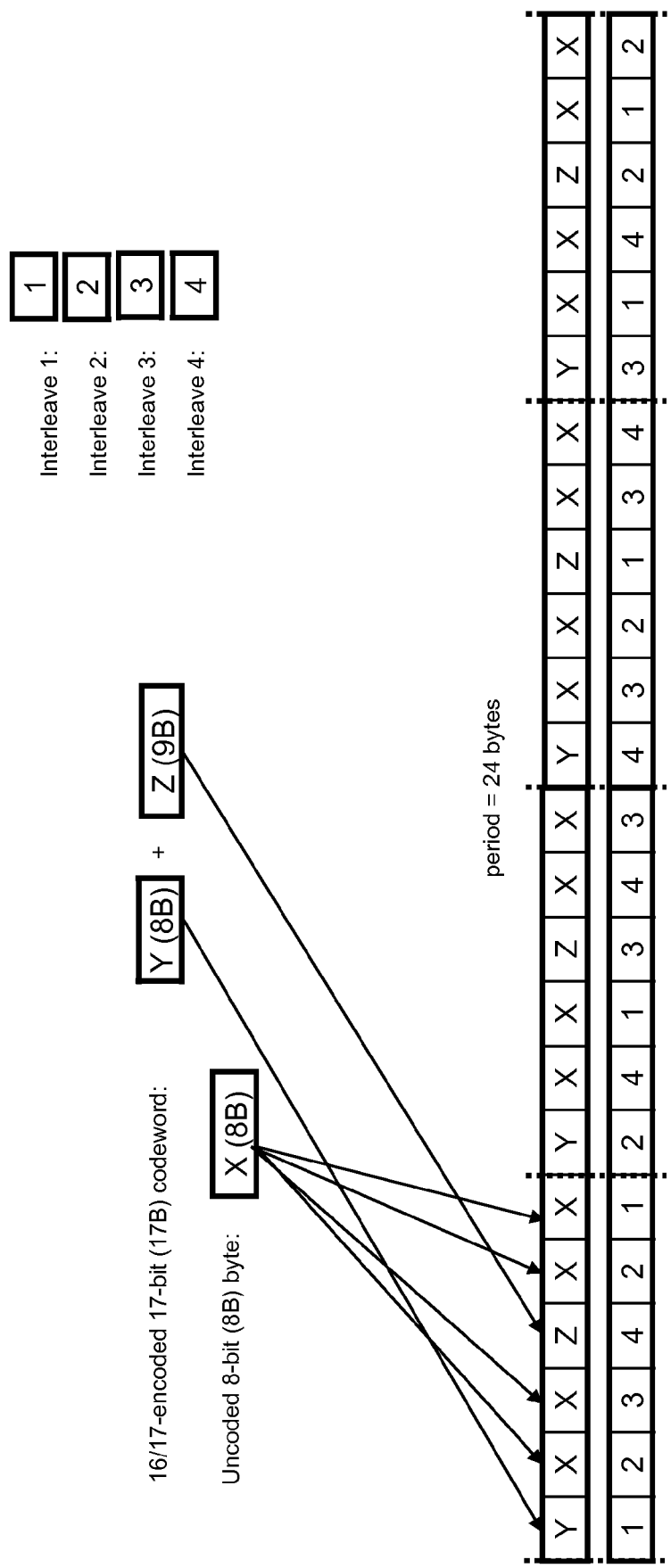
FIG. 6 illustrates a 4-way C1 interleaving scheme which may be implemented for the rate-48/49 PRML(G=22, I=15, M=31) code of the present invention.

In an embodiment of a rate-48/49 PRML code, m=48, n=16, s=8, $Q_1$=2, $P_1$=4, $P_2$=2 and $P_3$=2. The rate-16/17 PRML(G=6, I=7, M=15) mother code may be used to obtain a rate-48/49 PRML(G=22, I=15, M=31) code by breaking the codewords into $P_3$=2 pieces (8 bits and 9 bits) and inserting (m−n)/s=4 uncoded bytes in between (a coded block of 8 bits or 9 bits is always preceded and followed by two uncoded bytes). Coded data is precoded using a $1/(1 \oplus D^2)$ precoder and uncoded data may either be not precoded at all, $1/(1 \oplus D)$ precoded or $1/(1 \oplus D^2)$ precoded. From an error-rate performance viewpoint, it may be preferable to not use any precoding for the uncoded data. However, because $1/(1 \oplus D)$ precoding is already used in conjunction with write equalization in LTO 1-4, it may be therefore more desirable to use $1/(1 \oplus D)$ precoding. FIG. 6 illustrates a 4-way C1 interleaving scheme which may be implemented for the rate-48/49 PRML(G=22, I=15, M=31) code.

Rate-48/49 PRML(G=14, I=19, M=39) Code (RLL 3)

Figure 7:
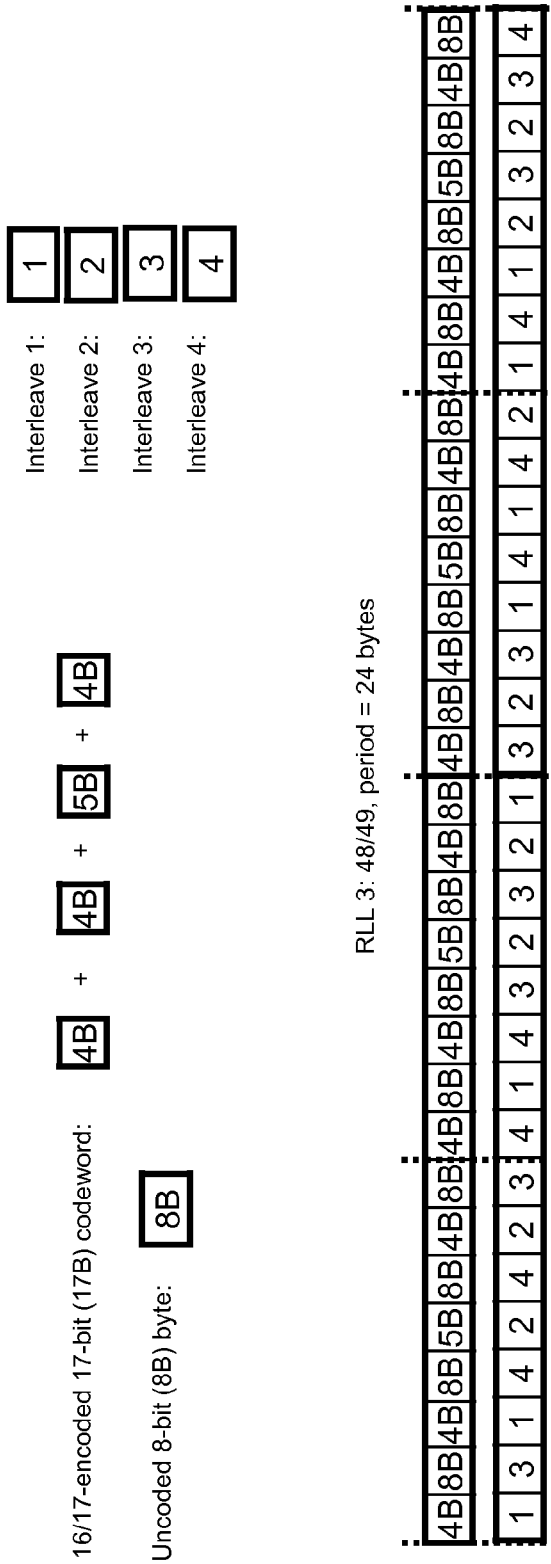
FIG. 7 illustrates a 4-way C1 interleaving scheme which may be implemented for the rate-48/49 PRML(G=14, I=19, M=39) code of the present invention.

In another embodiment of a rate-48/49 PRML code, m=48, n=16, s=8, $Q_1$=2, $P_1$=4, $P_2$=2 and $P_3$=4. A rate-48/49 PRML (G=14, I=19, M=39) code may be obtained by breaking the codewords of the rate-16/17 PRML(G=6, I=7, M=15) code into $P_3$=4 coded blocks (4 bits+4 bits+5 bits+4 bits) and inserting (m−n)/s=4 uncoded bytes in between (a coded block of 4 bits or 5 bits is always preceded and followed by an uncoded byte). However, this code may require redefining DSS and Re Sync patterns to ensure that the maximum length of modulation-encoded data that looks like DSS or Re Sync is not prohibitively large. FIG. 7 illustrates a 4-way C1 interleaving scheme which may be implemented for the rate-48/49 PRML(G=14, I=19, M=39) code.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable media include recordable-type media such as a floppy disk, a hard disk drive, a RAM, and CD-ROMs and transmission-type media.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for encoding a data input sequence of m bits into an output sequence codeword of m+1 bits or a method for deploying computing infrastructure comprising integrating computer readable code into a computing system for encoding a data input sequence of m bits into an output sequence codeword of m+1 bits.

What is claimed is:

1. A method for encoding a data input sequence of m bits into an output sequence codeword of m+1 bits, where m is an integer multiple of 16, the method comprising the steps of:
    receiving an unencoded m-bit input sequence;
    separating the m-bit input sequence into a first unencoded set of 16 bits and a second unencoded set of m−16 bits;
    encoding the first unencoded set into a rate-16/17 PRML (G=6, I=7, M=15) encoded sequence; and
    multiplexing the 16/17 encoded sequence with the second unencoded set to generate an encoded sequence of a rate-(m)/(m+1) PRML code.

2. The method of claim 1, wherein m is selected from the group comprising 32 and 48.

3. The method of claim 1, wherein the rate-(m)/(m+1) PRML code is selected from the group comprising a rate-32/33 PRML(G=14, I=11, M=23) code, a rate-48/49 PRML (G=22, I=15, M=31) code and a rate-48/49 PRML(G=14, I=19, M=39) code.

4. The method of claim 1, wherein encoding the first unencoded set into a rate-16/17 PRML (G=6, I=7, M=15) encoded sequence comprises processing the first unencoded set through a plurality K encoding stages, each having an output $o_k^E = M_k^E n_k^E = g_k^E(i_k^E) h_k^E(i_k^E)$, where the superscript E refers to the encoding operation, and the outputs of the first through $K^{th}$−1 stages become the inputs to the second through $K^{th}$ stages, respectively.

5. The method of claim 4, wherein K=3 and:
    the output of a first encoding stage comprises a PRML (G=6, I=9, M=20) code;
    the output of a second encoding stage comprises a PRML (G=6, I=7, M=15) code; and
    the output of a third encoding stage comprises a PRML (G=6, I=7, M=15) code.

6. The method of claim 4, wherein K=3 and:
    for a first encoding stage:
        the input column vector is represented by: $i_1^E = a^T = [a_1 \ a_2 \ \ldots \ a_{16}]^T$;
        the transformation matrix is represented by:

$$M_1^E = g_1^E(i_1^E) = [M_{1,1}^E \ M_{1,2}^E]$$

$$M_{1,1}^E = \begin{bmatrix} a_9 & a_1 & a_1 & a_1 & a_1 & a_1 & a_9 & a_1 & a_5 & a_5 & a_5 & a_5 & a_1 & a_1 & a_1 & a_1 \\ a_{10} & a_2 & a_2 & a_2 & a_2 & a_2 & a_{10} & a_2 & a_6 & a_6 & a_6 & a_6 & a_2 & a_2 & a_2 & a_2 \\ a_{11} & a_3 & a_3 & a_3 & a_3 & a_3 & a_{11} & a_3 & a_7 & a_7 & a_7 & a_7 & a_3 & a_3 & a_3 & a_3 \\ a_{12} & a_4 & a_4 & a_4 & a_4 & a_4 & a_{12} & a_4 & a_8 & a_8 & a_8 & a_8 & a_4 & a_4 & a_4 & a_4 \\ a_5 & a_9 & a_5 & a_5 & a_5 & a_5 & 0 & 0 & 0 & 0 & 0 & 0 & 0 & 1 & 1 & 1 \\ a_6 & a_{10} & a_6 & a_6 & a_6 & a_6 & 0 & 0 & 0 & 1 & 1 & 1 & 1 & 0 & 0 & 0 \\ a_7 & a_{11} & a_7 & a_7 & a_7 & a_7 & 0 & 1 & 1 & 0 & 0 & 1 & 1 & 0 & 0 & 1 \\ a_8 & a_{12} & a_8 & a_8 & a_8 & a_8 & 1 & 0 & 1 & 0 & 1 & 0 & 1 & 0 & 1 & 0 \\ 0 & 0 & 0 & 1 & 1 & 1 & 1 & 1 & 1 & 1 & 1 & 1 & 1 & 1 & 1 & 1 \\ 1 & 1 & 1 & 1 & 1 & 1 & 1 & 1 & 1 & 1 & 1 & 1 & 1 & 1 & 1 & 1 \\ 0 & 1 & 1 & 0 & 0 & 1 & 1 & 1 & 1 & 1 & 1 & 1 & 1 & 1 & 1 & 1 \\ 0 & 0 & 0 & 0 & 0 & 0 & 0 & 0 & 0 & 0 & 0 & 0 & 0 & 0 & 0 & 0 \\ 1 & 0 & 1 & 0 & 1 & 0 & 1 & 1 & 1 & 1 & 1 & 1 & 1 & 1 & 1 & 1 \\ a_{13} & a_{13} & a_{13} & a_{13} & a_{13} & a_9 & a_{13} & a_9 & a_9 & a_{13} & a_{13} & a_{13} & a_{13} & a_{13} & a_{13} & a_5 \\ a_{14} & a_{14} & a_{14} & a_{14} & a_{14} & a_{10} & a_{14} & a_{10} & a_{10} & a_{14} & a_{14} & a_{14} & a_{14} & a_{14} & a_{14} & a_6 \\ a_{15} & a_{15} & a_{15} & a_{15} & a_{15} & a_{11} & a_{15} & a_{11} & a_{11} & a_{15} & a_{15} & a_{15} & a_{15} & a_{15} & a_{15} & a_7 \\ a_{16} & a_{16} & a_{16} & a_{16} & a_{16} & a_{12} & a_{16} & a_{12} & a_{12} & a_{16} & a_{16} & a_{16} & a_{16} & a_{16} & a_{16} & a_8 \end{bmatrix}$$

$$M_{1,2}^E = \begin{bmatrix} a_1 & a_1 & 0 & 0 & 0 & 0 & 0 & 0 & 1 & 1 & 1 & 1 & 1 & a_1 \\ a_2 & a_2 & 0 & 0 & 0 & 1 & 1 & 1 & 1 & 0 & 0 & 0 & 0 & 1 & 1 & a_2 \\ a_3 & a_3 & 0 & 1 & 1 & 0 & 0 & 1 & 1 & 0 & 0 & 1 & 1 & 0 & 0 & a_3 \\ a_4 & a_4 & 1 & 0 & 1 & 0 & 1 & 0 & 1 & 0 & 1 & 0 & 1 & 0 & 1 & a_4 \\ 1 & 1 & 1 & 1 & 1 & 1 & 1 & 1 & 1 & 1 & 1 & 1 & 1 & 1 & a_5 \\ 0 & 1 & 1 & 1 & 1 & 1 & 1 & 1 & 1 & 1 & 1 & 1 & 1 & 1 & a_6 \\ 1 & 0 & 0 & 0 & 0 & 0 & 0 & 0 & 0 & 0 & 0 & 0 & 0 & 0 & a_7 \\ 1 & 0 & 1 & 1 & 1 & 1 & 1 & 1 & 1 & 1 & 1 & 1 & 1 & 1 & a_8 \\ 1 & 1 & 1 & 1 & 1 & 1 & 1 & 1 & 1 & 1 & 1 & 1 & 1 & 1 & a_9 \\ 1 & 1 & 1 & 1 & 1 & 1 & 1 & 1 & 1 & 1 & 1 & 1 & 1 & 1 & a_{10} \\ 1 & 1 & 1 & 1 & 1 & 1 & 1 & 1 & 1 & 1 & 1 & 1 & 1 & 1 & a_{11} \\ 0 & 0 & 0 & 0 & 0 & 0 & 0 & 0 & 0 & 0 & 0 & 0 & 0 & 0 & 1 \\ 1 & 1 & 1 & 1 & 1 & 1 & 1 & 1 & 1 & 1 & 1 & 1 & 1 & 1 & a_{12} \\ a_5 & a_5 & a_9 & a_{13} & a_{13} & a_{13} & a_5 & a_5 & a_5 & a_1 & a_1 & a_1 & 0 & 0 & 0 & a_{13} \\ a_6 & a_6 & a_{10} & a_{14} & a_{14} & a_{14} & a_6 & a_6 & a_6 & a_2 & a_2 & a_2 & 0 & 0 & 0 & a_{14} \\ a_7 & a_7 & a_{11} & a_{15} & a_{15} & a_7 & a_7 & a_7 & a_7 & a_3 & a_3 & a_3 & 1 & 1 & 1 & a_{15} \\ a_8 & a_8 & a_{12} & a_{16} & a_{16} & a_{16} & a_8 & a_8 & a_8 & a_4 & a_4 & a_4 & 1 & 1 & 1 & a_{16} \end{bmatrix}$$

the partitioning column vector is represented by: $n_1^E = h_1^E(i_1^E) = p^T = [p_1 \, p_2 \ldots p_{32}]^T$, where the following six auxiliary variables:

$v_1 = \overline{a_1 + a_2 + a_3 + a_4}$ $v_2 = \overline{a_5 + a_6 + a_7 + a_8}$ $v_3 = \overline{a_9 + a_{10} + a_{11} + a_{12}}$ $v_4 = \overline{a}_9 a_{10} \overline{a}_{11} \overline{a}_{12}$ $v_5 = a_9 a_{10} a_{11} a_{12}$ $v_6 = \overline{a_{13} + a_{14} + a_{15} + a_{16}}$ are used to express the components of the partitioning vector:

$p_1 = v_1 \overline{v}_2 \overline{v}_3 \overline{v}_4 \overline{v}_5 \overline{v}_6$,
$p_2 = \overline{v}_1 v_2 \overline{v}_3 \overline{v}_4 \overline{v}_5 \overline{v}_6$,
$p_3 = \overline{v}_1 \overline{v}_2 v_3 \overline{v}_4 \overline{v}_5 \overline{v}_6$,
$p_4 = \overline{v}_1 \overline{v}_2 \overline{v}_3 v_4 \overline{v}_5 \overline{v}_6$,
$p_5 = \overline{v}_1 \overline{v}_2 \overline{v}_3 \overline{v}_4 v_5 \overline{v}_6$,
$p_6 = \overline{v}_1 \overline{v}_2 \overline{v}_3 \overline{v}_4 \overline{v}_5 v_6$,
$p_7 = v_1 v_2 \overline{v}_3 \overline{v}_4 \overline{v}_5 \overline{v}_6$,
$p_8 = v_1 \overline{v}_2 v_3 \overline{v}_4 \overline{v}_5 \overline{v}_6$,
$p_9 = v_1 \overline{v}_2 \overline{v}_3 v_4 \overline{v}_5 \overline{v}_6$,
$p_{10} = v_1 \overline{v}_2 \overline{v}_3 \overline{v}_4 v_5 \overline{v}_6$,
$p_{11} = v_1 \overline{v}_2 \overline{v}_3 \overline{v}_4 \overline{v}_5 v_6$,
$p_{12} = v_1 \overline{v}_2 \overline{v}_3 \overline{v}_4 v_5 \overline{v}_6$,
$p_{13} = \overline{v}_1 v_2 v_3 \overline{v}_4 \overline{v}_5 \overline{v}_6$,
$p_{14} = \overline{v}_1 v_2 \overline{v}_3 v_4 \overline{v}_5 \overline{v}_6$,
$p_{15} = \overline{v}_1 v_2 \overline{v}_3 \overline{v}_4 v_5 \overline{v}_6$,
$p_{16} = \overline{v}_1 v_2 \overline{v}_3 \overline{v}_4 \overline{v}_5 v_6$,
$p_{17} = \overline{v}_1 v_2 v_3 \overline{v}_4 v_5 \overline{v}_6$,
$p_{18} = \overline{v}_1 v_2 \overline{v}_3 v_4 \overline{v}_5 v_6$,
$p_{19} = v_1 \overline{v}_2 v_3 \overline{v}_4 v_5 \overline{v}_6$,
$p_{20} = v_1 v_2 \overline{v}_3 v_4 \overline{v}_5 \overline{v}_6$,
$p_{21} = v_1 v_2 \overline{v}_3 \overline{v}_4 v_5 \overline{v}_6$,
$p_{22} = v_1 v_2 \overline{v}_3 \overline{v}_4 \overline{v}_5 v_6$,
$p_{23} = v_1 \overline{v}_2 v_3 v_4 \overline{v}_5 \overline{v}_6$,
$p_{24} = v_1 \overline{v}_2 v_3 \overline{v}_4 v_5 \overline{v}_6$,
$p_{25} = v_1 \overline{v}_2 v_3 \overline{v}_4 \overline{v}_5 v_6$,
$p_{26} = \overline{v}_1 v_2 v_3 v_4 \overline{v}_5 \overline{v}_6$,
$p_{27} = \overline{v}_1 v_2 v_3 \overline{v}_4 v_5 \overline{v}_6$,
$p_{28} = \overline{v}_1 v_2 v_3 \overline{v}_4 \overline{v}_5 v_6$,
$p_{29} = v_1 v_2 v_3 \overline{v}_4 \overline{v}_5 \overline{v}_6$,
$p_{30} = v_1 v_2 v_3 v_4 \overline{v}_5 \overline{v}_6$,
$p_{31} = v_1 v_2 v_3 \overline{v}_4 v_5 \overline{v}_6$,
$p_{32} = \overline{v}_1 v_2 v_3 v_4 v_5 \overline{v}_6$, and the output vector is represented by:

$o_1^E = M_1^E n_1^E = b^T = [b_1 \, b_2 \ldots b_{17}]^T$;

for a second encoding stage:
the input column vector is represented by: $i_2^E = b^T = [b_1 \, b_2 \ldots b_{17}]^T$;
the transformation matrix is represented by: $M_2^E = g_2^E(i_2^E)$ $$M_2^E = \begin{bmatrix} b_2 & 0 & b_4 & b_{14} & b_6 & b_{10} & b_8 & b_{12} & b_9 & 0 & b_{11} & 0 & b_{13} & 1 & b_{15} & b_{16} & b_{17} \\ b_{14} & 1 & b_2 & b_2 & b_{11} & b_{10} & b_{13} & b_{12} & b_1 & 0 & b_3 & 0 & b_5 & 1 & b_7 & b_{16} & b_{17} \\ b_{14} & b_{15} & 1 & b_2 & b_{10} & b_{11} & b_{12} & b_{13} & 1 & 1 & 1 & 1 & 1 & 0 & 1 & b_{16} & b_{17} \\ b_1 & b_2 & b_2 & b_2 & b_5 & b_6 & b_7 & b_8 & b_9 & b_{10} & b_{11} & b_{12} & b_{13} & b_{14} & b_{15} & b_{16} & b_{17} \end{bmatrix}^T$$

the partitioning column vector is represented by: $n_2^E h_2^E (i_2^E) = q^T = [q_1\ q_2\ q_3\ q_4]^T$ where:

$q_1 = \overline{b_1 + b_3 + b_5 + b_7}$ $q_2 = \overline{b_2 + b_4 + b_6 + b_8}$ $q_3 = b_1\ b_2\ b_3\ b_4\ b_5\ b_6\ b_7\ b_8$ $q_4 = \overline{q_1 + q_2 + q_3}$ and the output column vector is represented by: $o_2^E = M_2^E n_2^E = c^T = [c_1\ c_2\ \ldots\ c_{17}]^T$; and for a third encoding stage:

the input column vector is represented by: $i_3^E = c^T = [c_1\ c_2\ \ldots\ c_{17}]^T$;

the transformation matrix is represented by: $M_3^E = g_3^E (i_3^E)$ $$M_3^E = \begin{bmatrix} c_{10} & c_{12} & 1 & 1 & 0 & 0 & 0 & 0 & c_9 & 1 & c_{11} & 0 & c_{13} & c_{14} & c_{15} & c_{16} & c_{17} \\ c_1 & c_2 & c_3 & c_4 & c_5 & c_6 & 1 & 1 & 0 & c_7 & 0 & c_8 & 0 & 1 & 1 & 0 & 1 \\ c_1 & c_2 & c_3 & c_4 & c_5 & c_6 & c_7 & c_8 & c_9 & c_{10} & c_{11} & c_{12} & c_{13} & c_{14} & c_{15} & c_{16} & c_{17} \end{bmatrix}^T$$

the partitioning column vector is represented by: $n_3^E = h_3^E (i_3^E) = u^T = [u_1\ u_2\ u_3]^T$ where $u_1 = \overline{c_1} \overline{c_2} \overline{c_3}\ c_4\ c_5 \overline{c_6} \overline{c_7} \overline{c_8}$ $u_2 = \overline{c_9} \overline{c_{10}} \overline{c_{11}} \overline{c_{12}}\ c_{13}\ c_{14}\ c_{15}\ c_{16}\ c_{17}$ $u_3 = \overline{u_1 + u_2}$ and the output column vector is represented by: $o_3^E = M_3^E n_3^E = y^T = [y_1\ y_2\ \ldots\ y_{17}]^T$.

7. The method of claim 6, further comprising:

receiving an encoded input sequence of a rate-(m)/(m+1) PRML code;

separating the received encoded input sequence into a first received encoded rate-16/17 PRML (G=6, I=7, M=15) sequence and a second received sequence of m−16 bits;

decoding the first received encoded rate-16/17 sequence into a 16-bit decoded sequence in K=3 decoding stages by performing operations in the $1^{st}$ decoding stage which are inverse to the operations performed by the $3^{rd}$ encoding stage, performing operations in the $2^{nd}$ decoding stage which are inverse to the operations performed by the $2^{nd}$ encoding stage and performing operations in the $3^{rd}$ decoding stage which are inverse to the operations performed by the $1^{st}$ encoding stage; and multiplexing the 16-bit decoded sequence with the second received sequence of m−16 bits to generate the decoded m-bit sequence which is equal to the original unencoded m-bit sequence if the received bits are not in error.

8. The method of claim 1, wherein:

the second unencoded sequence comprises 16 bits;

the rate-(m)/(m+1) PRML code comprises a rate-32/33 PRML(G=14, I=11, M=23) code; and the method further comprises:

dividing the 16/17 encoded sequence into two encoded subblocks of 8 and 9 bits, respectively;

dividing the second unencoded set into two unencoded subblocks of 8 bits each; and multiplexing the 16/17 encoded sequence with the second unencoded set by interleaving the two unencoded subblocks with the two encoded subblocks.

9. The method of claim 2, wherein:

the rate-(m)/(m+1) PRML code comprises a rate-48/49 PRML(G=22, I=15, M=31) code;

the second unencoded sequence comprises 32 bits; and the method further comprises:

dividing the 16/17 encoded sequence into two encoded subblocks of 8 and 9 bits, respectively;

dividing the second unencoded set into two unencoded subblocks of 16 bits each; and multiplexing the 16/17 encoded sequence with the second unencoded set by interleaving the two unencoded subblocks with the two encoded subblocks.

10. The method of claim 2, wherein:

the second unencoded sequence comprises 32 bits; the rate-(m)/(m+1) PRML code comprises a rate-48/49 PRML(G=14, I=19, M=39) code; and the method further comprises:

dividing the 16/17 encoded sequence into four encoded subblocks of 4, 4, 5 and 4 bits, respectively;

dividing the second unencoded set into four unencoded subblocks of 8 bits each; and multiplexing the 16/17 encoded sequence with the second unencoded set by interleaving the four unencoded subblocks with the four encoded subblocks.

11. The method of clam 2, further comprising:

receiving an encoded input sequence of a rate-(m)/(m+1) PRML code;

separating the received encoded input sequence into a first received encoded rate-16/17 PRML (G=6, I=7, M=15) sequence and a second received sequence of m−16 bits;

decoding the first received encoded sequence into a 16-bit decoded sequence; and multiplexing the 16-bit decoded sequence with the second received sequence to generate the decoded m-bit sequence which is equal to the original unencoded m-bit sequence if the received bits are not in error.

12. The method of claim 11, wherein decoding the first received encoded sequence into the 16-bit decoded sequence comprises processing the first received encoded sequence through a plurality K decoding stages, each having an output $o_k^D = M_k^D n_k^D = g_k^D(i_k^D) h_k^D(i_k^D)$, where the superscript B refers to the decoding operation, and the outputs of the first through $K^{th} - 1$ stages become the inputs to the second through $K^{th}$ stages, respectively.

13. A system for encoding a data input sequence of m bits into an output sequence codeword of m+1 bits, where m is an integer multiple of 16, comprising:

a demultiplexor operable to receive an unencoded m-bit input sequence and separate the m-bit input sequence into a first unencoded set of 16 bits and a second unencoded set of m−16 bits;

a plurality K of encoding stages operable to encode the first unencoded set into a rate-16/17 PRML (G=6, I=7, M=15) encoded sequence; and a multiplexor operable to multiplex the 16/17 encoded sequence with the second unencoded set to generate an encoded sequence of a rate-(m)/(m+1) PRML code.

14. The system of claim 13, wherein m is selected from the group comprising 32 and 48.

15. The system of claim 13, wherein the rate-(m)/(m+1) PRML code is selected from the group comprising a rate-32/33 PRML(G=14, I=11, M=23) code, a rate-48/49 PRML (G=22, I=15, M=31) code and a rate-48/49 PRML(G=14, I=19, M=39) code.

16. The system of claim 13, wherein each encoding stage has an output $o_k^E = M_k^E n_k^E = g_k^E(i_k^E) h_k^E(i_k^E)$, where the superscript E refers to the encoding operation, and the outputs of the first through $K^{th}-1$ stages become the inputs to the second through $K^{th}$ stages, respectively.

17. The system of claim 16, further comprising:
a demultiplexor operable to receive an encoded input sequence of a rate-(m)/(m+1) PRML code and separate the received encoded input sequence into a first received encoded rate-16/17 PRML (G=6, I=7, M=15) sequence and a second received sequence of m−16 bits;
K=3 decoding stages to decode the first received encoded rate-16/17 sequence into a 16-bit decoded sequence by performing operations in the $1^{st}$ decoding stage which are inverse to the operations performed by the $3^{rd}$ encoding stage, performing operations in the $2^{nd}$ decoding stage which are inverse to the operations performed by the $2^{nd}$ encoding stage and performing operations in the $3^{rd}$ decoding stage which are inverse to the operations performed by the $1^{st}$ encoding stage; and
a multiplexor operable to multiplex the 16-bit decoded sequence with the second received sequence of m−16 bits to generate the decoded m-bit sequence which is equal to the original unencoded m-bit sequence if the received bits are not in error.

18. The system of claim 16 wherein K=3 and:
a first encoding stage outputs a PRML(G=6, I=9, M=20) code;
a second encoding stage outputs a PRML(G=6, I=7, M=15) code; and
a third encoding stage outputs a PRML(G=6, I=7, M=15) code.

19. The system of claim 13, wherein:
the second unencoded sequence comprises 16 bits;
the rate-(m)/(m+1) PRML code comprises a rate-32/33 PRML(G=14, I=11, M=23) code;
the demultiplexor is further operable to divide the 16/17 encoded sequence into two encoded subblocks of 8 and 9 bits, respectively, and to divide the second unencoded set into two unencoded subblocks of 8 bits each; and
the multiplexor is further operable to multiplex the 16/17 encoded sequence with the second unencoded set by interleaving the two unencoded subblocks with the two encoded subblocks.

20. The system of claim 13, wherein:
the second unencoded sequence comprises 32 bits;
the rate-(m)/(m+1) PRML code comprises a rate-48/49 PRML(G=22, I=15, M=31) code;
the demultiplexor is further operable to divide the 16/17 encoded sequence into two encoded subblocks of 8 and 9 bits, respectively, and to divide the second unencoded set into two unencoded subblocks of 16 bits each; and
the multiplexor is further operable to multiplex the 16/17 encoded sequence with the second unencoded set by interleaving the two unencoded subblocks with the two encoded subblocks.

21. The system of claim 13, wherein:
the second unencoded sequence comprises 32 bits;
the rate-(m)/(m+1) PRML code comprises a rate-48/49 PRML(G=14, I=19, M=39) code;
the demultiplexor is further operable to divide the 16/17 encoded sequence into four encoded subblocks of 4, 4, 5 and 4 bits, respectively, and to divide the second unencoded set into four unencoded subblocks of 8 bits each; and
the multiplexor is further operable to multiplex the 16/17 encoded sequence with the second unencoded set by interleaving the four unencoded subblocks with the four encoded subblocks.

22. The system of claim 13, further comprising:
a demultiplexor operable for receiving an encoded input sequence of a rate-(m)/(m+1) PRML code and separating the received encoded input sequence into a first received encoded rate-16/17 PRML (G=6, I=7, M=15) sequence and a second received sequence of m−16 bits;
a decoder operable to decode the first received encoded sequence into a 16-bit decoded sequence; and
a multiplexor operable to multiplex the 16-bit decoded sequence with the second received sequence to generate the decoded m-bit sequence which is equal to the original unencoded m-bit sequence if the received bits are not in error.

23. The system of claim 22, wherein the decoder is operable to decode the first received encoded sequence into the i6-bit decoded sequence comprises processing the first received encoded sequence through a plurality K decoding stages, each having an output $o_k^D = M_k^D n_k^D = g_k^D(i_k^D) h_k^D(i_k^D)$, where the superscript D refers to the decoding operation, and the outputs of the first through $K^{th}-1$ stages become the inputs to the second through $K^{th}$ stages, respectively.

24. An encoder for encoding a data input sequence of m bits into an output sequence codeword of m+1 bits, where m is an integer multiple of an ECC symbol size s, comprising:
a demultiplexor operable to receive a data stream of unencoded m-bit input sequences and divide each m-bit input sequence into a first block of n bits and a second block of m-n unencoded bits, where n is an integer multiple of s;
a plurality of encoder stages operable to:
encode the first block of n bits into a first set of n+1 encoded bits, wherein at least one of P1 subblocks of the first set of n+bits satisfies a G constraint, an M constraint and an I constraint;
map in a one-to-one manner the first set of n+1 encoded bits into a second set of n+1 encoded bits wherein, at least one of P2 subblocks of the second set of n+1 bits gives rise to at least Q1 transitions after $1/(1+D^2)$ precoding; and
divide the second set of n+1 encoded bits into P3 encoded subblocks; and
a multiplexor operable to interleave the P3 encoded subblocks among (m−n)/s unencoded symbols so as to form the (m+1)-bit output sequence codeword to be stored on a data storage medium.

25. The encoder of claim 24, wherein the P3 encoded subblocks form a rate-(m)/(m+1) PRML code selected from the group comprising a rate-32/33 PRML(G=14, I=11, M=23) code, a rate-48/49 PRML(G=22, I=15, M=31) code and a rate-48/49 PRML(G=14, I=19, M=39) code.

26. The encoder of claim 24, wherein each encoding stage has an output $o_k^E = M_k^E n_k^E = g_k^E(i_k^E) h_k^E(i_k^E)$, where the superscript E refers to the encoding operation, and the outputs of the first through $K^{th}+31$ 1 stages become the inputs to the second through $K^{th}$ stages, respectively.

27. The encoder of claim 26 wherein K=3 and:
- a first encoding stage outputs a PRML(G=6, I=9, M=20) code;
- a second encoding stage outputs a PRML(G=6, I=7, M=15) code; and
- a third encoding stage outputs a PRML(G=6, I=7, M=15) code.

28. The encoder of claim 24, comprising a decoder for decoding a received sequence of m+1 bits into an output sequence of m bits, where m is an integer multiple of an ECC symbol size s, comprising:
- a demultiplexor operable to receive a data stream of a received encoded rate-(m)/(m+1) codeword sequence and divide the received codeword sequence into a first received encoded rate-(n)/(n+1) sequence and a second block of m−n received bits, where n is an integer multiple of s;
- a plurality of decoder stages operable to decode the received rate-(n)/(n+1) encoded sequence into n decoded bits; and
- a multiplexor operable to interleave the n decoded bits with a second block of m−n received bits so as to form an m-bit sequence which is equal to the original unencoded m-bit sequence if the received bits are not in error.

29. The decoder of claim 28, wherein decoding the rate-(n)/(n+1) sequence into n decoded bits comprises processing the rate-(n)/(n+1) sequence through a plurality K decoding stages, each having an output $o_k^D = M_k^D n_k^D = g_k^D = g_k^D(i_k^D) h_k^D(i_k^D)$, where the superscript D refers to the decoding operation, and the outputs of the first through $K^{th}-1$ stages become the inputs to the second through $K^{th}$ stages, respectively.

* * * * *